(12) United States Patent
Hopkins et al.

(10) Patent No.: US 12,520,493 B2
(45) Date of Patent: Jan. 6, 2026

(54) MICROELECTRONIC DEVICES INCLUDING CAP STRUCTURES, AND RELATED ELECTRONIC SYSTEMS AND METHODS

(71) Applicant: Micron Technology, Inc., Boise, ID (US)

(72) Inventors: John D. Hopkins, Meridian, ID (US); Alyssa N. Scarbrough, Boise, ID (US); Jordan D. Greenlee, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 703 days.

(21) Appl. No.: 17/658,778

(22) Filed: Apr. 11, 2022

(65) Prior Publication Data

US 2023/0209831 A1 Jun. 29, 2023

Related U.S. Application Data

(60) Provisional application No. 63/266,027, filed on Dec. 27, 2021.

(51) Int. Cl.
*H10B 43/35* (2023.01)
*H10B 43/27* (2023.01)

(52) U.S. Cl.
CPC .............. *H10B 43/35* (2023.02); *H10B 43/27* (2023.02)

(58) Field of Classification Search
None
See application file for complete search history.

(56) References Cited

U.S. PATENT DOCUMENTS

2018/0122906 A1\* 5/2018 Yu .......................... H10B 41/27
2019/0386108 A1\* 12/2019 Nishikawa .......... H10D 30/6894
2020/0161325 A1\* 5/2020 Clampitt ................ H10B 43/27

\* cited by examiner

*Primary Examiner* — Xiaoming Liu
(74) *Attorney, Agent, or Firm* — TraskBritt

(57) ABSTRACT

A microelectronic device includes a source stack, a source contact vertically adjacent to the source stack, a semiconductor material vertically adjacent to the source contact, tiers of alternating conductive materials and dielectric materials vertically adjacent to the semiconductor dielectric material, a dielectric structure within a slot structure and extending through the tiers of the microelectronic device to the source contact of the microelectronic device, oxide cap structures laterally between the semiconductor material and the dielectric structure, and pillars extending through the tiers, the semiconductor material, and the source contact and into the source stack. Related electronic systems and methods are also disclosed.

25 Claims, 28 Drawing Sheets tion of an apparatus including one or more electronic
MICROELECTRONIC DEVICES INCLUDING CAP STRUCTURES, AND RELATED ELECTRONIC SYSTEMS AND METHODS

CROSS-REFERENCE TO RELATED APPLICATION

This application claims the benefit under 35 U.S.C. § 119(e) of U.S. Provisional Patent Application Ser. No. 63/266,027, filed Dec. 27, 2021, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including cap structures, and related electronic systems and methods of forming the microelectronic devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternates conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain region of a string is adjacent one of the top or bottom of the pillar, while a source region of the string is adjacent the other of the top or bottom of the pillar. The drain region is operably connected to a bit line, and the source region is operably connected to a source line. A 3D NAND memory device also includes electrical connections between, e.g., access lines (e.g., word lines) and other conductive structures of the device so that the memory cells of the vertical strings can be selected for writing, reading, and erasing operations.

In conventional 3D NAND electronic devices, the pillars including the channels are formed through multiple polysilicon materials, and lateral contact with the channels is achieved by a laterally-oriented, doped polysilicon material. However, undesirable etching of semiconductive materials during fabrication causes processing challenges. Therefore, designing and fabricating electronic devices continues to be challenging with desired electrical performance.

DETAILED DESCRIPTION

Figure 1A:
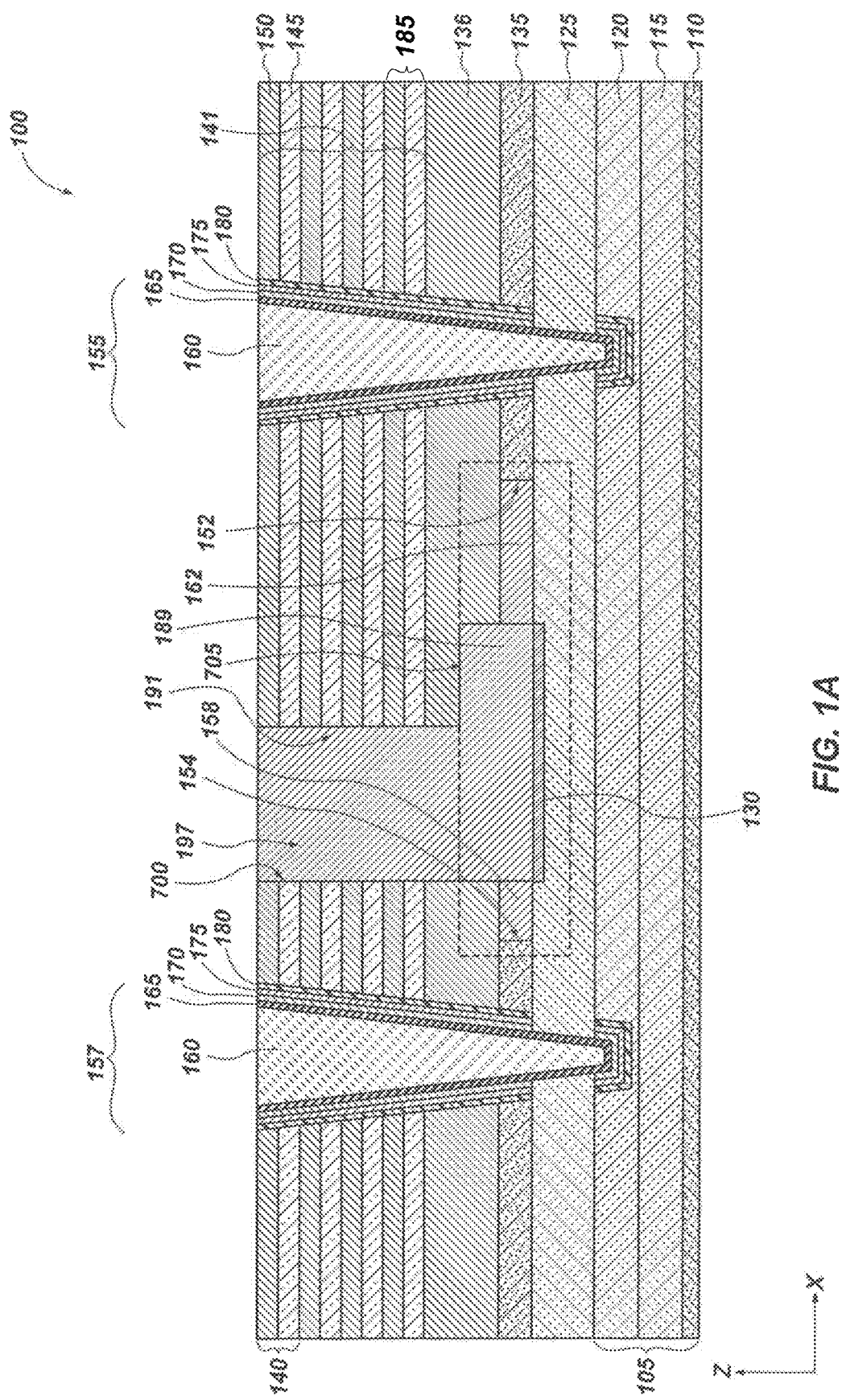
FIGS. 1A and 1B are cross-sectional, elevational, schematic illustrations of a microelectronic device structure in accordance with embodiments of the disclosure, with FIG. 1B being an enlargement of the region indicated in FIG. 1A.

The illustrations included herewith are not meant to be actual views of any particular systems, microelectronic structures, microelectronic devices, or integrated circuits thereof, but are merely idealized representations that are employed to describe embodiments herein. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "homogeneous" means relative amounts of elements (e.g., chemical elements) included in a feature (e.g., a material, a structure) do not vary throughout different portions (e.g., different horizontal portions, different vertical portions) of the feature. Conversely, as used herein, the term "heterogeneous" means relative amounts of elements (e.g., chemical elements) included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, "insulative material" and "dielectric material" mean and include an electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material and/or dielectric material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" and/or a "dielectric material" means and includes a structure formed of and including an insulative material.

As used herein, the terms "opening" and "slit" mean and include a volume extending through at least one structure or at least one material, leaving a void (e.g., gap) in that at least one structure or at least one material, or a volume extending between structures or materials, leaving a gap between the structures or materials. Unless otherwise described, an "opening" and/or "slit" is not necessarily empty of material. That is, an "opening" and/or "slit" is not necessarily void space. An "opening" and/or "slit" formed in or between structures or materials may comprise structure(s) or material(s) other than that in or between which the opening is formed. And, structure(s) or material(s) "exposed" within an "opening" and/or "slit" is (are) not necessarily in contact with an atmosphere or non-solid environment. Structure(s) or material(s) "exposed" within an "opening" and/or "slit" may be adjacent or in contact with other structure(s) or material(s) that is (are) disposed within the "opening" and/or "slit."

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "slit sacrificial structure" may refer to a structure (e.g., plug) utilized to at least partially stop an etch or removal process within a microelectronic device structure during formation of a slit (e.g., a slit or slot structure utilized to access and remove source contact sacrificial structures and to accomplish gate replacement processes).

Figure 1B:
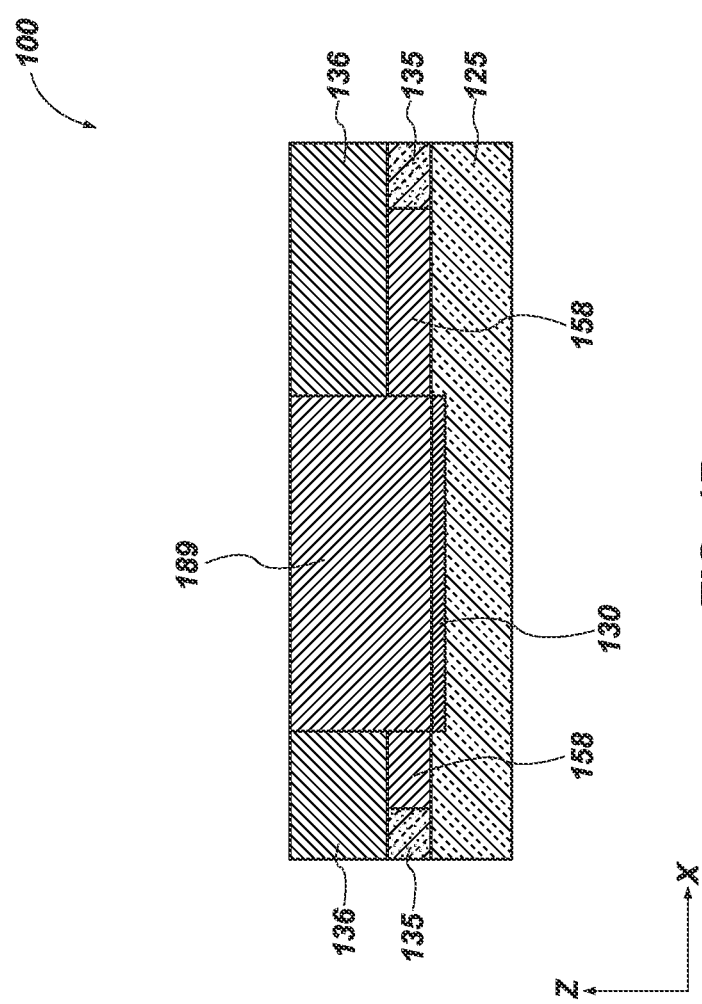

A microelectronic device structure 100 for a microelectronic device (e.g., a memory device, such as a 3D NAND Flash memory device) according to embodiments of the disclosure is shown in FIGS. 1A and 1B. FIG. 1A is a simplified, partial cross-sectional view of the microelectronic device structure 100 within an XZ-plane. FIG. 1B is an enlargement of the portion of FIG. 1A indicated by the dashed line in FIG. 1A. Referring to FIGS. 1A and 1B together, the microelectronic device structure 100 may include a source stack 105 that includes one or more conductive materials, such as a conductive liner material 110, a source material 115, and a semiconductor material 120 (e.g., a doped semiconductive material). The conductive liner material 110 may be disposed on (e.g., vertically adjacent to) a base material (not shown), the source material 115 may be disposed on (e.g., vertically adjacent to) the conductive liner material 110, and the semiconductor material 120 may be disposed on (e.g., vertically adjacent to) the source material 115. A source contact 125 may be disposed on (e.g., vertically adjacent to) the source stack 105 and may include an oxidized portion 130 (described in greater detail below). Another semiconductor material 135 (e.g., a doped semiconductive material) may be disposed on (e.g., vertically adjacent to) the source contact 125. In some embodiments, a material of the semiconductor material 135 may be selected to be selectively removable under some etch conditions and to be resistant to removal under other etch conditions. An insulative cap material 136 (e.g., an oxide cap) may be disposed on (e.g., vertically adjacent to) the semiconductor material 135.

A stack structure 141 including tiers 140 of alternating insulative structures 145 and conductive structures 150 is disposed on (e.g., vertically adjacent to) the insulative cap material 136. The stack structure 141 and the microelectronic device structure 100 may represent a structure post (e.g., subsequent to) one or more so-called "replacement gate" or "gate last" processes have been conducted. For example, the microelectronic device structure 100 may include a structure (e.g., the stack structure) formed by at least partially replacing sacrificial materials (e.g., dielectric material, such as dielectric nitride material) of sacrificial structures with one or more conductive materials (e.g., at least one metal, such as tungsten (W)) to form the conductive structures 150. Replacement gate processing acts may include selectively removing (e.g., selectively etching and/or exhuming) the sacrificial structures of a precursor stack structure through slots (e.g., slit 700 (FIG. 2K)) formed in the precursor stack structure, and filling the resulting void spaces with conductive material (e.g., tungsten) to form the conductive structures 150. As is described herein, some of the conductive structures 150 may function as access line structures (e.g., word line structures) for the microelectronic device structure 100, and some other of the conductive structures 150 may function as select gate structures for the microelectronic device structure 100. At least one lower conductive structure 150 of the stack structure 141 formed from the precursor stack structure may be employed as at least one lower select gate (e.g., at least one source side select gate (SGS)) of the microelectronic device structure 100. In some embodiments, a single (e.g., only one) conductive structure 150 of a vertically lowermost tier of the stack structure 141 is employed as a lower select gate (e.g., an SGS) of the microelectronic device structure 100. In addition, upper conductive structures 150 of the stack structure 141 may be employed as upper select gates (e.g., drain side select gates (SGDs)) of the microelectronic device structure 100. One or more of the tiers 140 proximal to the semiconductor material 135 functions as the select gate source (SGS) and one or more of the tiers 140 distal to the semiconductor material 135 functions as the select gate drain (SGD). In some embodiments, horizontally neighboring conductive structures 150 of one or more vertically upper tiers 502 of the stack structure 141 are employed as upper select gates (e.g., SGDs) of the microelectronic device structure 100.

Referring still to FIGS. 1A and 1B, the microelectronic device structure 100 includes pillars 155, 157 (e.g., memory pillars, memory cells) that extend through the tiers 140, the insulative cap material 136, the semiconductor material 135, the source contact 125, and at least partially into the semiconductor material 120. The pillars 155, 157 include a fill material 160, a channel material 165, a tunnel dielectric material 170, a charge trap material 175, and a charge blocking material 180. The tunnel dielectric material 170, the charge trap material 175, and the charge blocking material 180 function as tunneling structures of the pillars 155, 157 of the microelectronic device structure 100.

The microelectronic device structure 100 may include a dielectric structure 197 (e.g., a dielectric material deposited within previously made slot structure 700 (also referred to herein as "slit 700") utilized during the "replacement gate" or "gate last" processing acts described herein) extending vertically through the stack structure 141, through the insulative cap material 136, and through the semiconductor material 135. The dielectric structure 197 may be disposed on (e.g., vertically adjacent to) the oxidized portion 130 of the source contact 125. In some embodiments, the dielectric structure 197 may have an upper portion 191 and a lower portion 189. Furthermore, the dielectric structure 197 may transition from the upper portion 191 to the lower portion 189 in a vertical direction at a vertical position correlating to a vertical position spanned by the insulative cap material 136 above the semiconductor material 135. In some embodiments, the lower portion 189 of the dielectric structure 197 may have a greater width than a width of the upper portion 191 of the dielectric structure 197 in the X-direction as shown in FIG. 1A. For instance, the lower portion 189 of the dielectric structure 197 may exhibit an increased width in at least one X-direction relative to the upper portion 191 of the dielectric structure 197. In some embodiments, the lower portion 189 of the dielectric structure 197 may have a width at least substantially equal to a width in an X-direction of the oxidized portion 130 of the source contact 125.

Additionally, on at least one side of the dielectric structure 197 in the X-direction, the semiconductor material 135 may be recessed away from the dielectric structure 197 relative to the tiers 140 and the insulative cap material 136, both of which contact the dielectric structure 197 and are directly laterally adjacent to the dielectric structure 197. For example, on at least one side (e.g., lateral side, horizontal side) of the dielectric structure 197 in the X-direction, the semiconductor material 135 may terminate in the X-direction at lateral edge surface that is spaced apart from the dielectric structure 197 by at least some distance. As a non limiting example, on a first side of the dielectric structure 197, the semiconductor material 135 may terminate in the X-direction at a first lateral edge surface 154 that is spaced apart from the dielectric structure 197, and on a second, opposite side of the dielectric structure 197, the semiconductor material 135 may terminate in the X-direction at a second lateral edge surface 152 that is spaced apart from the dielectric structure 197.

Furthermore, an oxide cap structure (e.g., an insulative cap structure) may be disposed between any lateral edge surface of the semiconductor material 135 facing the dielectric structure 197 and the dielectric structure 197 itself in the X-direction. Moreover, the oxide cap structure may be disposed between the insulative cap material 136 and the source contact 125 in the Z-direction and may at least substantially span a vertical distance between the insulative cap material 136 and the source contact 125, as shown in FIG. 1A. For example, a first oxide cap structure 158 (e.g., oxide body) may be between the first lateral edge surface 154 of the semiconductor material 135 and the dielectric structure 197 in the X-direction and between the insulative cap material 136 and the source contact 125 in the Z-direction, and a second oxide cap structure 162 (e.g., oxide body) may be between the second lateral edge surface 152 of the semiconductor material 135 and the dielectric structure 197 in the X-direction and between insulative cap material 136 and the source contact 125 in the Z-direction. In some embodiments, each of the first oxide cap structure 158 and the second oxide cap structure 162 may have a width in the X-direction within a range of about 1.0 nm to about 50.0 nm. For example, one or more of the first oxide cap structure 158 and the second oxide cap structure 162 may have a width of about 30.0 nm. Furthermore, the first oxide cap structure 158 may have a width that is different than a width of the second oxide cap structure 162. Additionally, the first and second oxide cap structures 158, 162 may include one or more of the insulative and dielectric materials described herein.

Referring still to FIGS. 1A and 1B, the pillars 155, 157 (e.g., memory cells) are laterally adjacent to the conductive structures 150 of the tiers 140. The source contact 125 may be in direct contact with a lower surface (e.g., a lower horizontal surface) of the semiconductor material 135 and in direct contact with an upper surface of the semiconductor material 120. The source contact 125 also is in direct contact with a portion of the pillars 155, 157, such as directly contacting upper horizontal surfaces and lower horizontal surfaces of the tunnel dielectric material 170, the charge trap material 175, and the charge blocking material 180 and directly contacting the channel material 165. The tunnel dielectric material 170, the charge trap material 175, and the charge blocking material 180 of the pillars 155, 157 are separated into discrete portions that extend above and below the source contact 125, while the channel material 165 and the fill material 160 extend substantially continuously an entire height of the pillars 155. However, in some embodiments, the fill material 160 may include an interior void. The source contact 125 may be separated from (e.g., isolated from) a lowermost tier (e.g., the SGS) by the semiconductor material 135 and the insulative cap material 136.

Figure 2A:
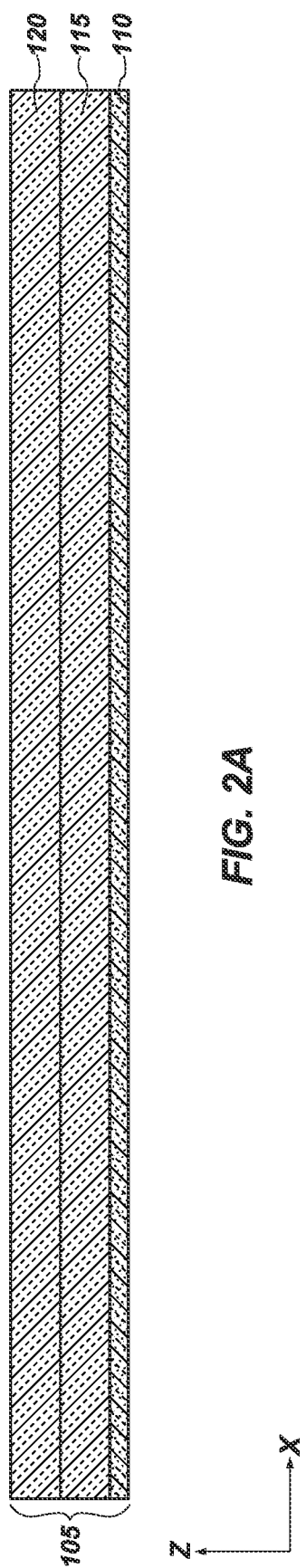
FIGS. 2A-2R are cross-sectional, elevational, schematic illustrations during various processing acts to fabricate a microelectronic device structure in accordance with embodiments of the disclosure.
Figure 2B:
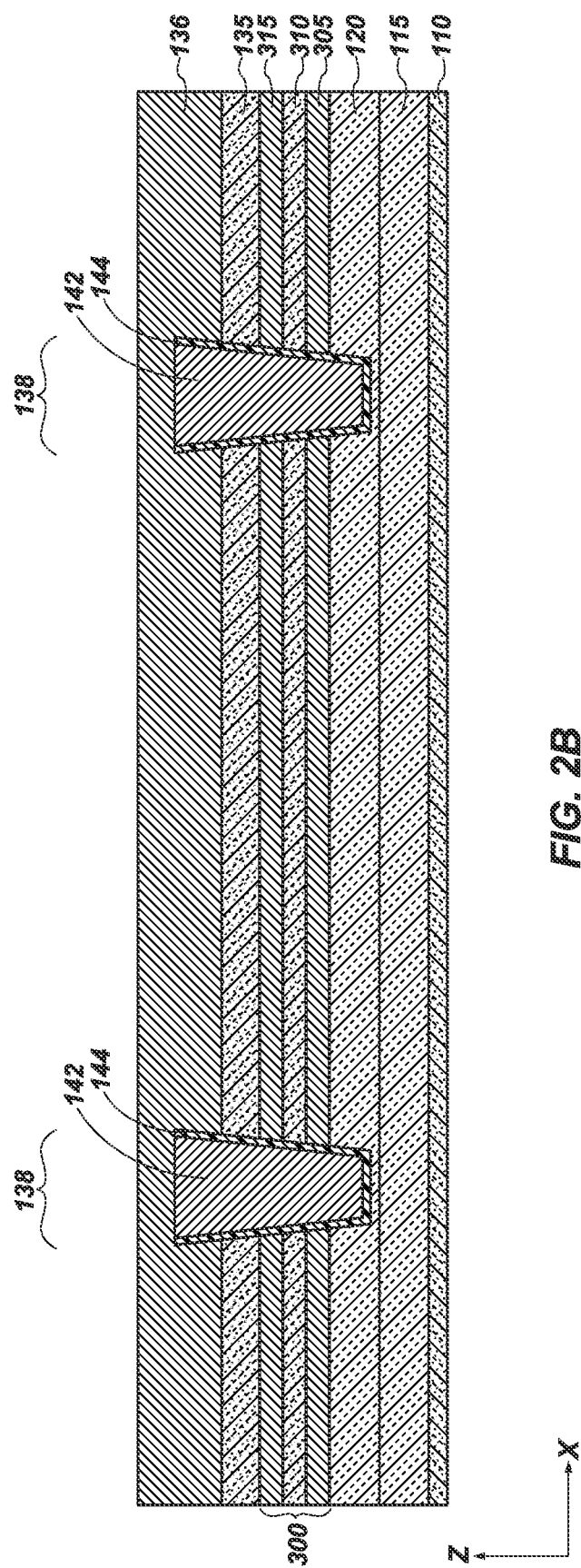
Figure 2C:
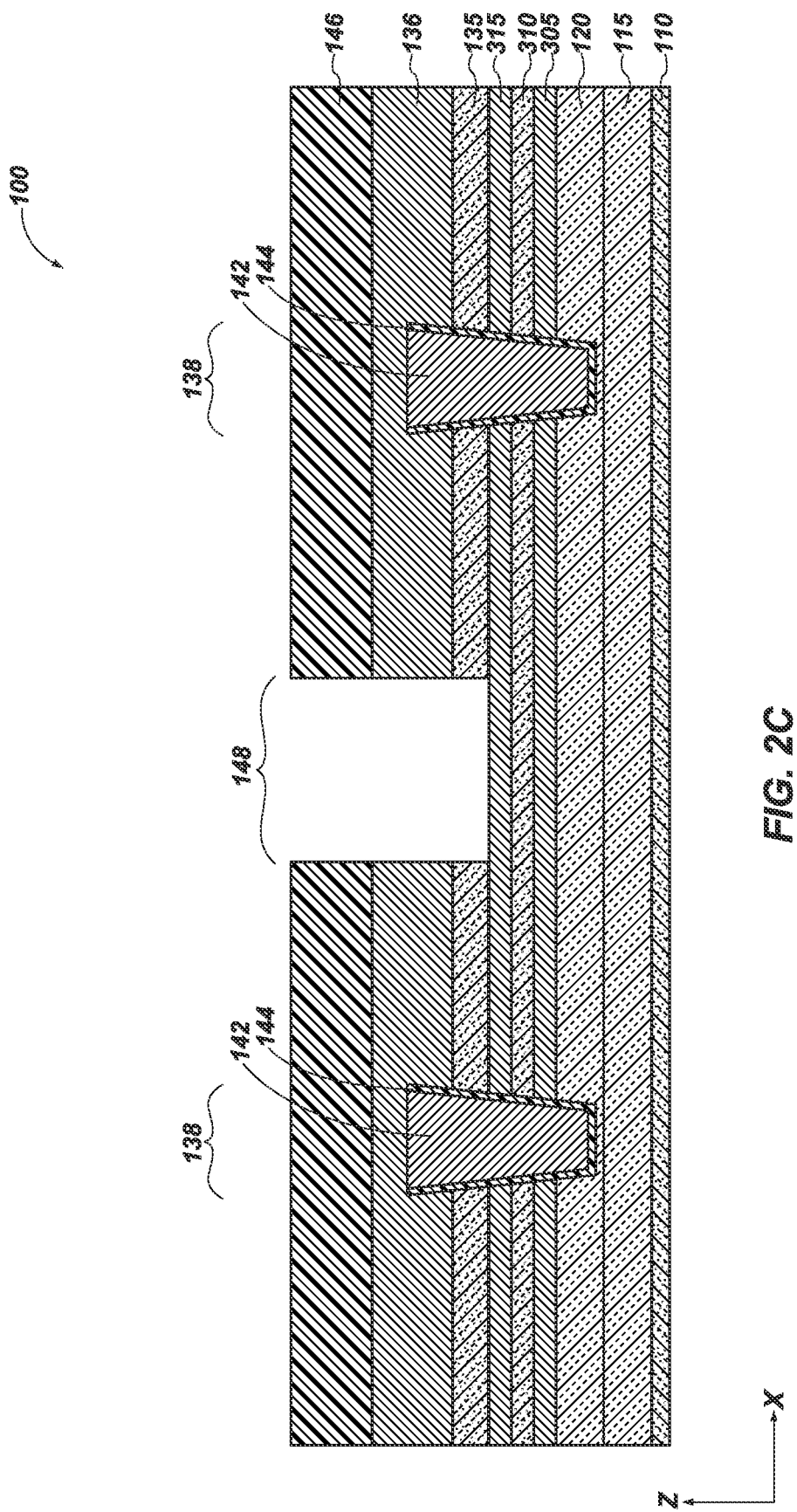
Figure 2D:
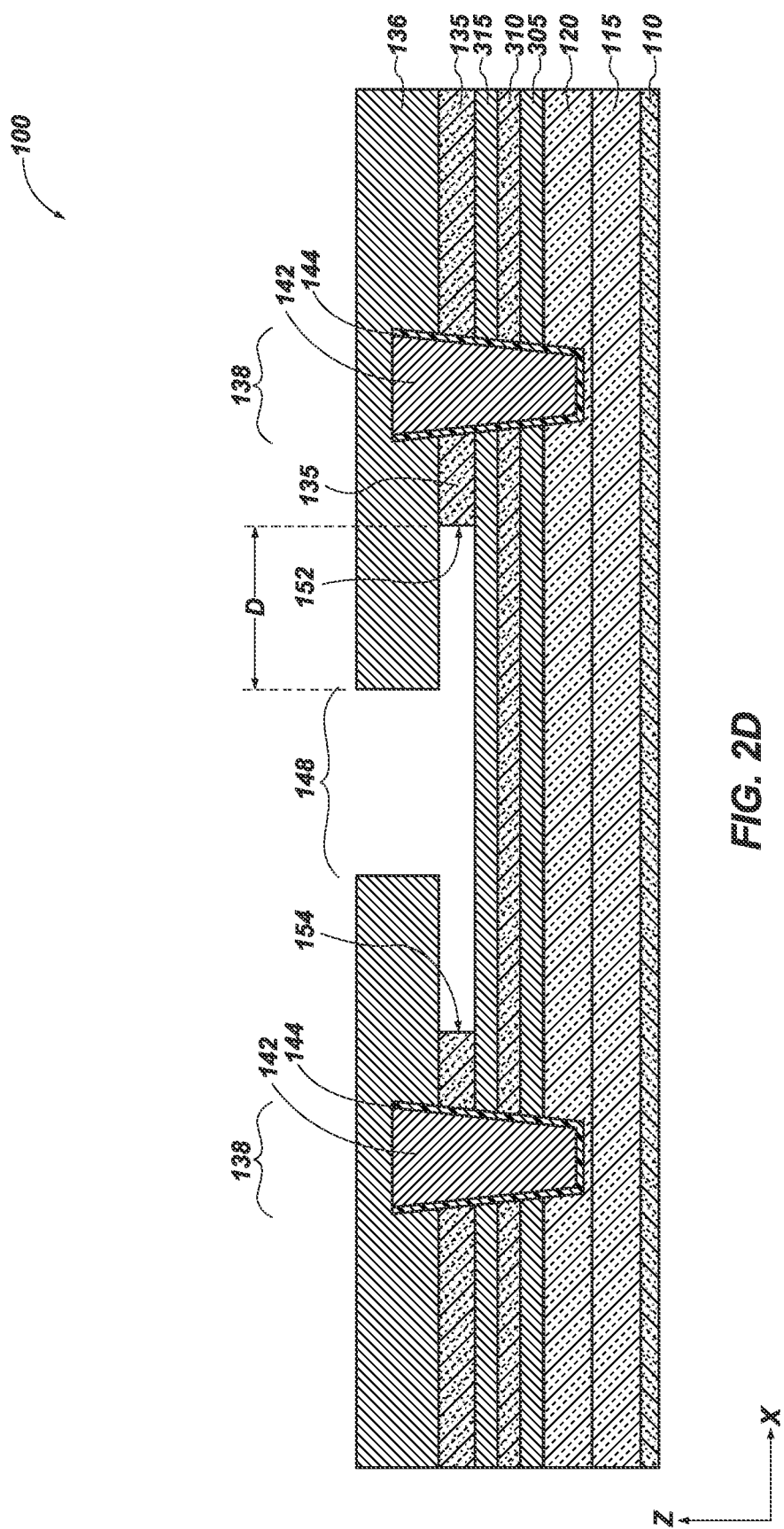
Figure 2E:
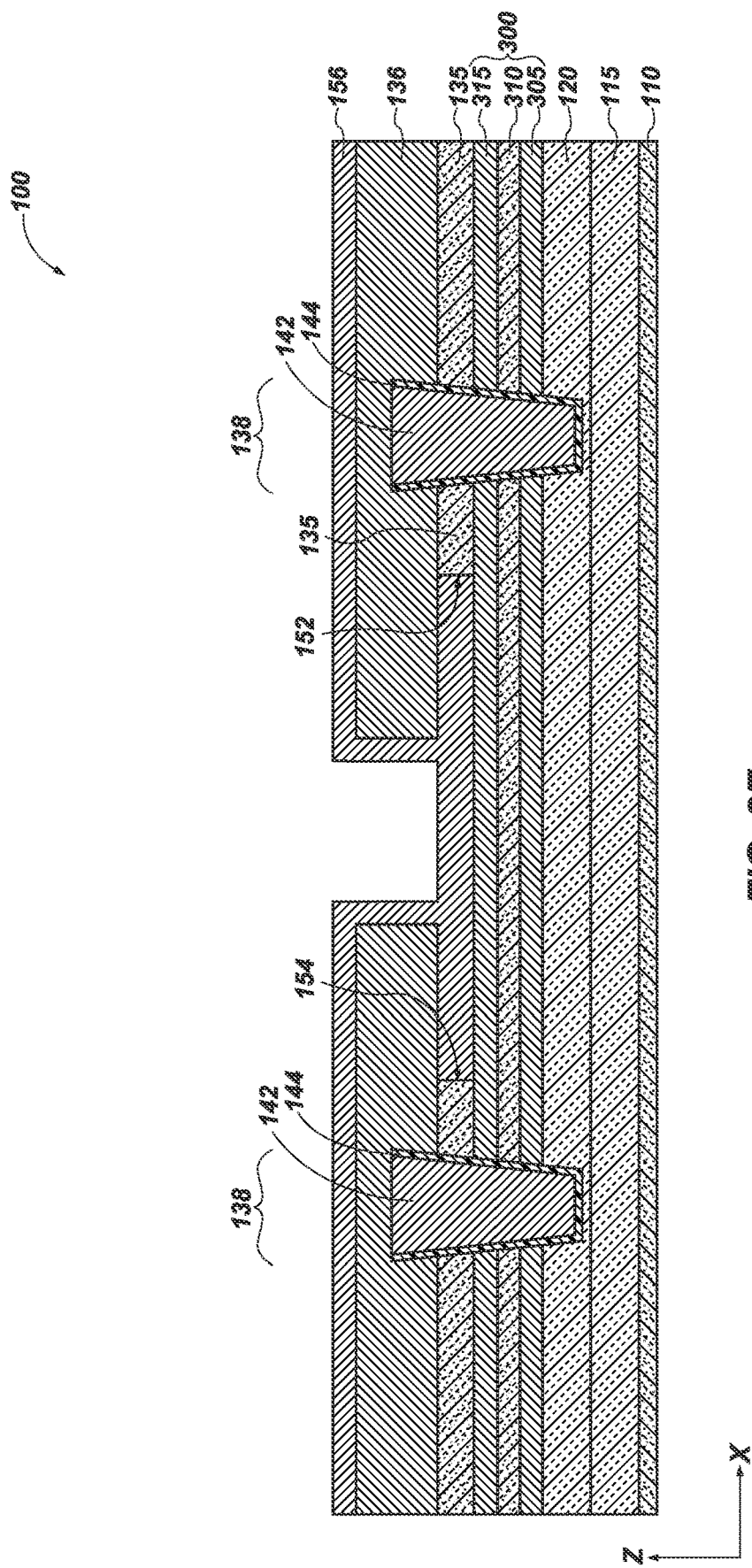
Figure 2F:
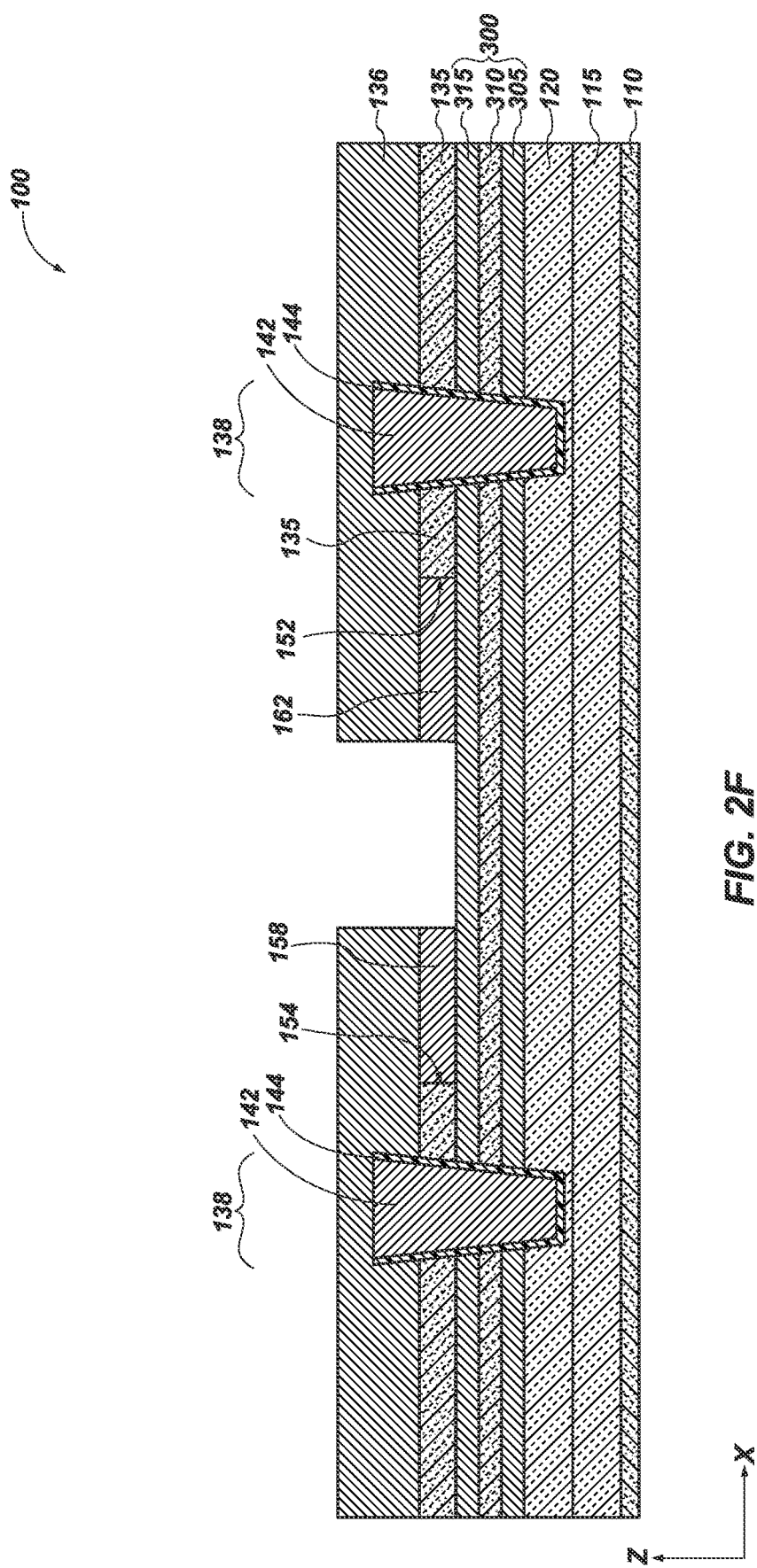
Figure 2G:
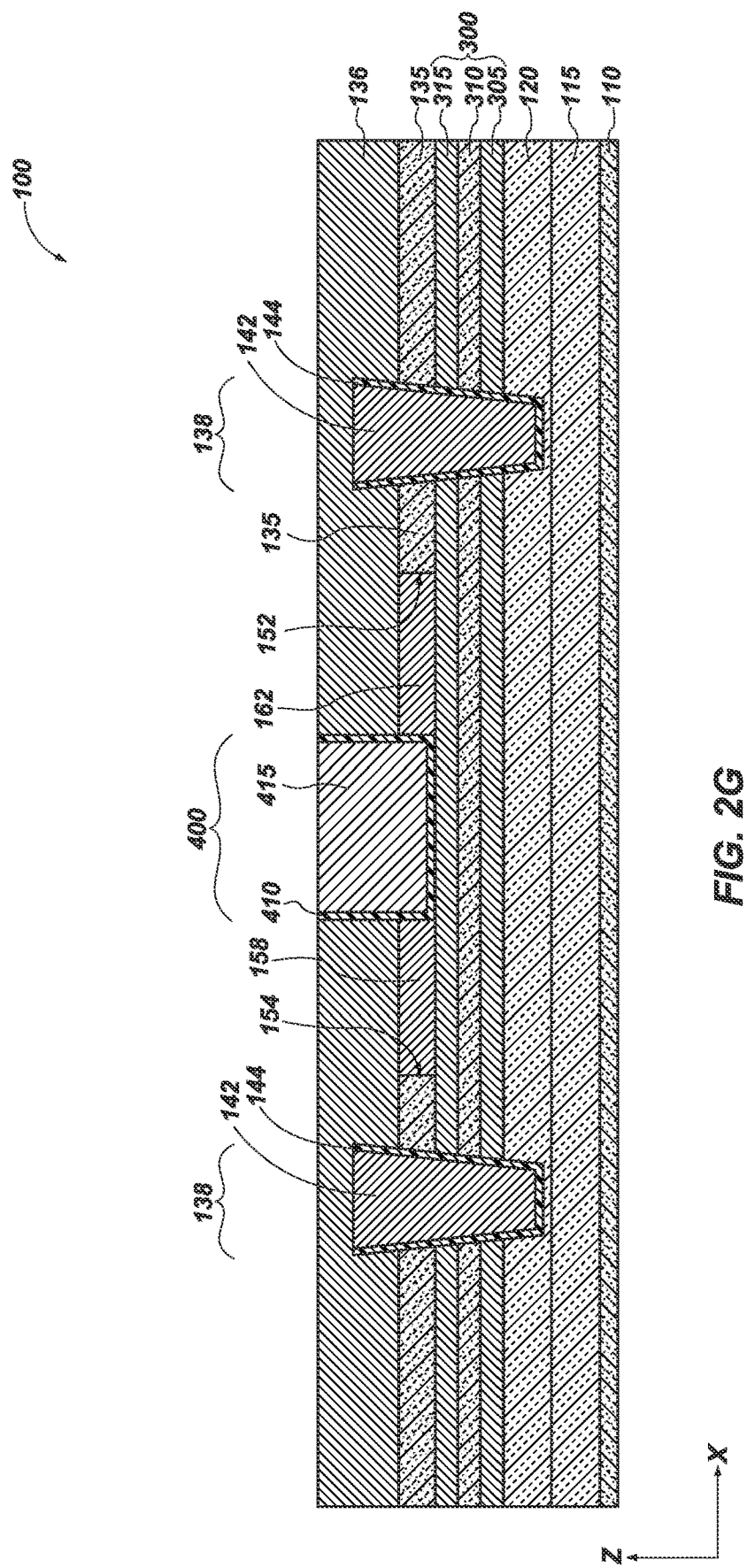
Figure 2H:
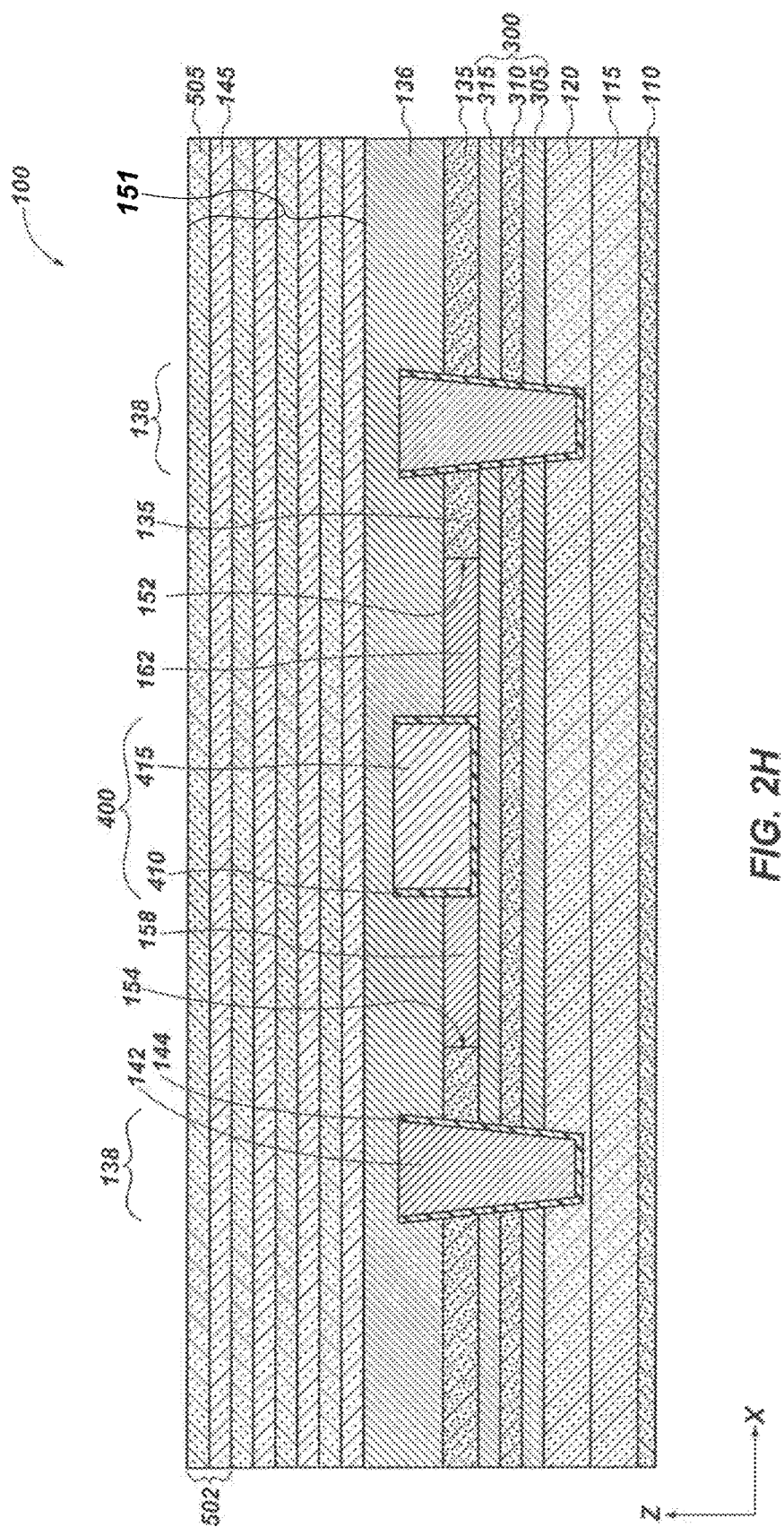
Figure 2I:
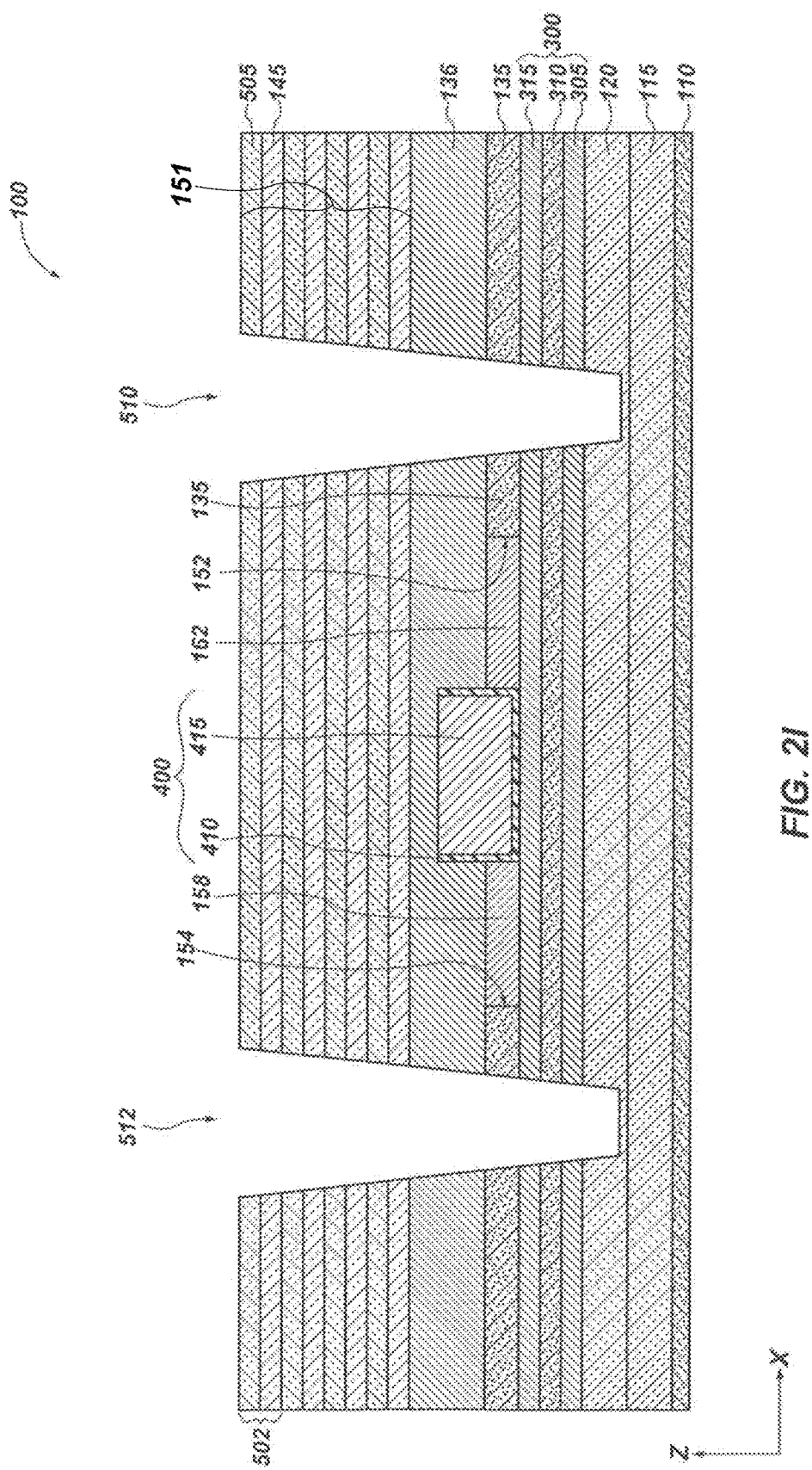
Figure 2J:
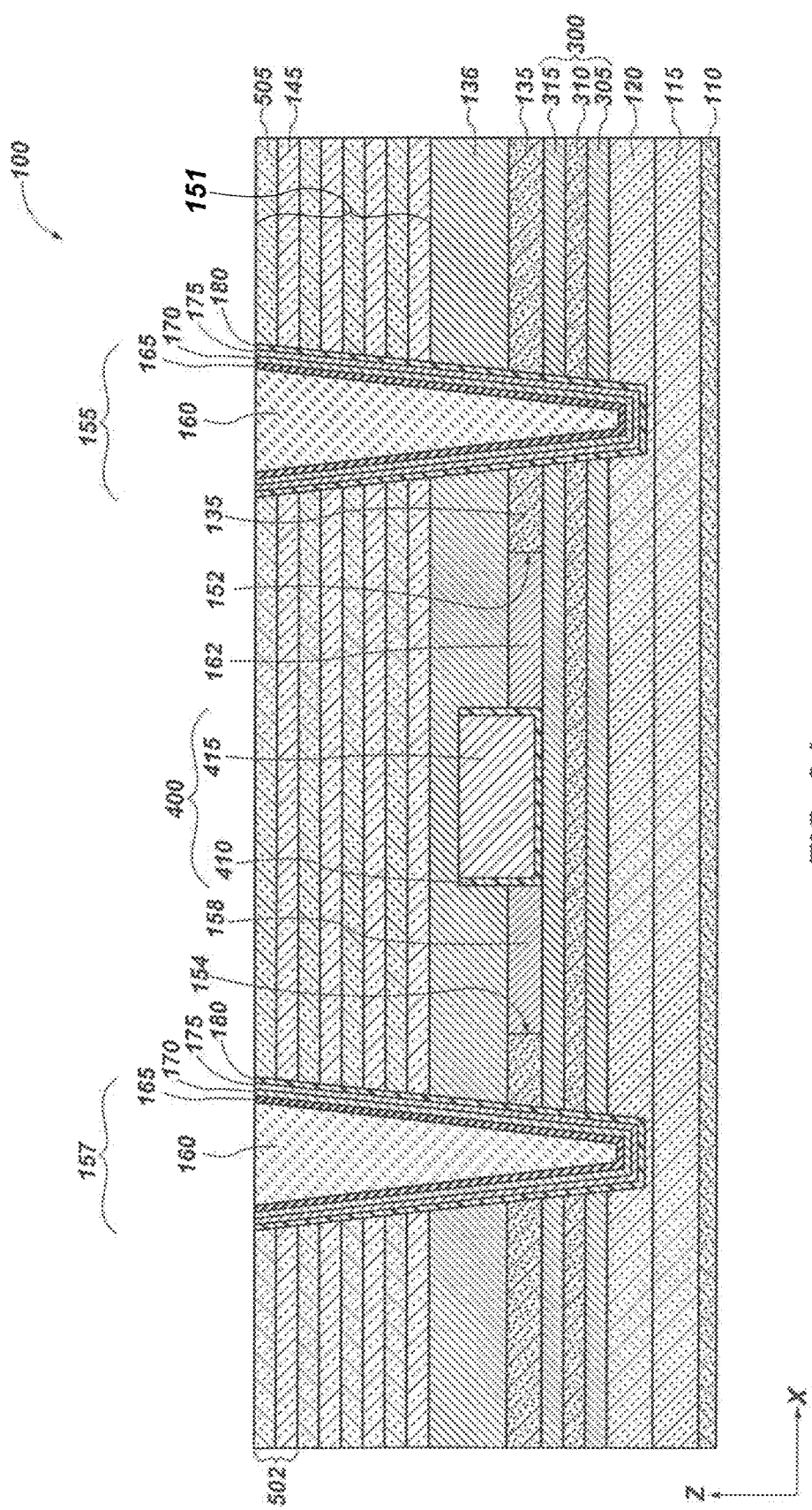
Figure 2K:
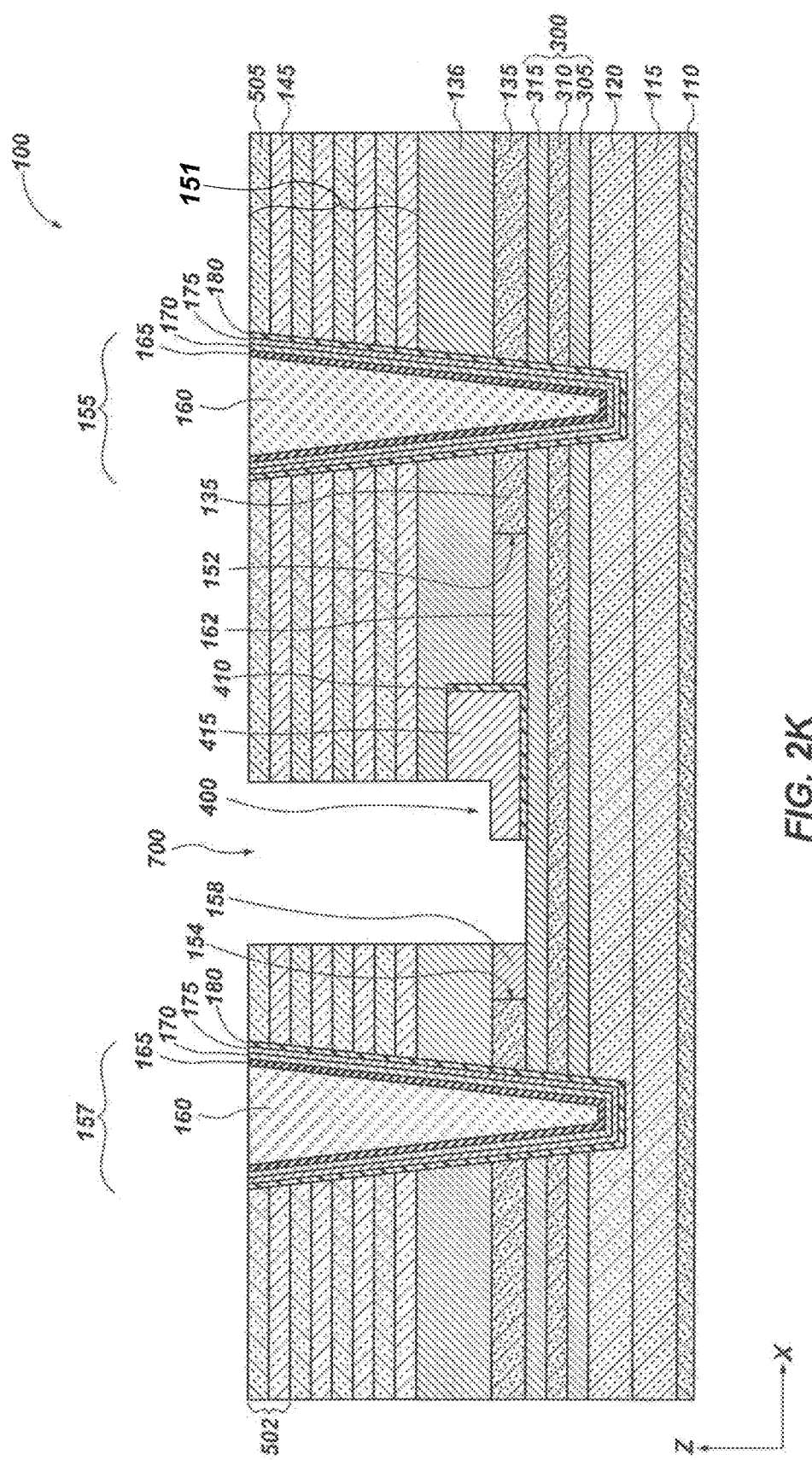
Figure 2L:
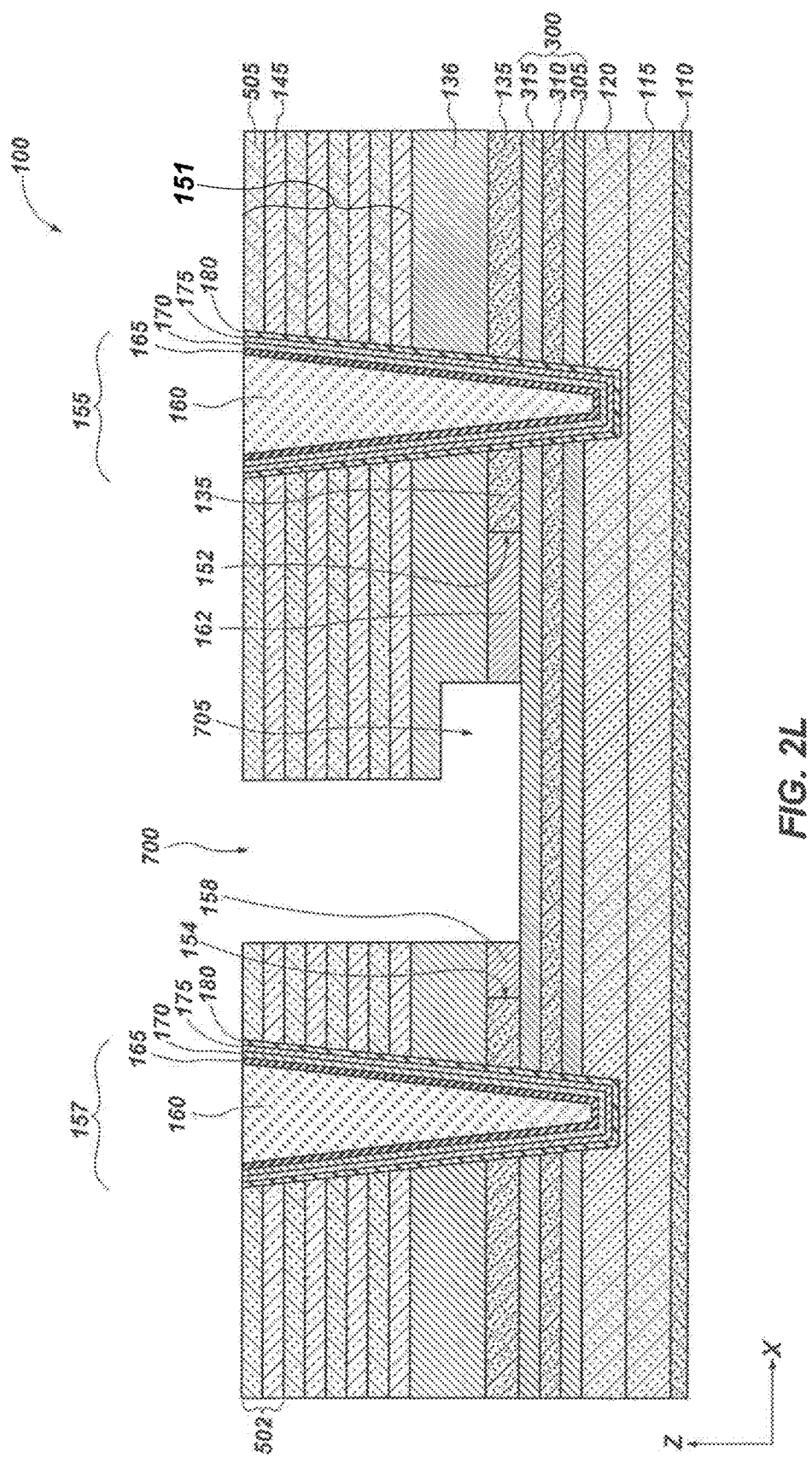
Figure 2M:
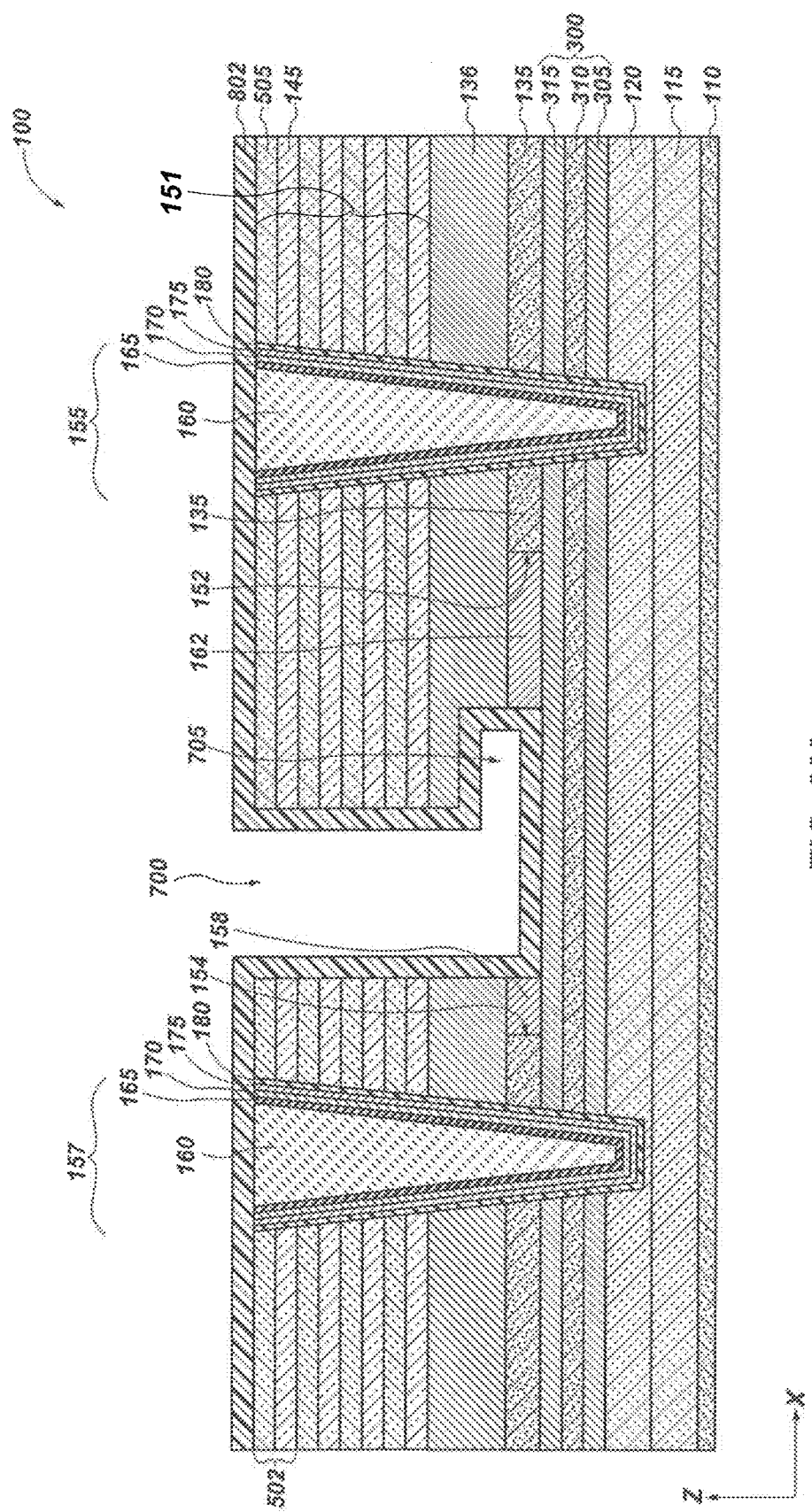
Figure 2N:
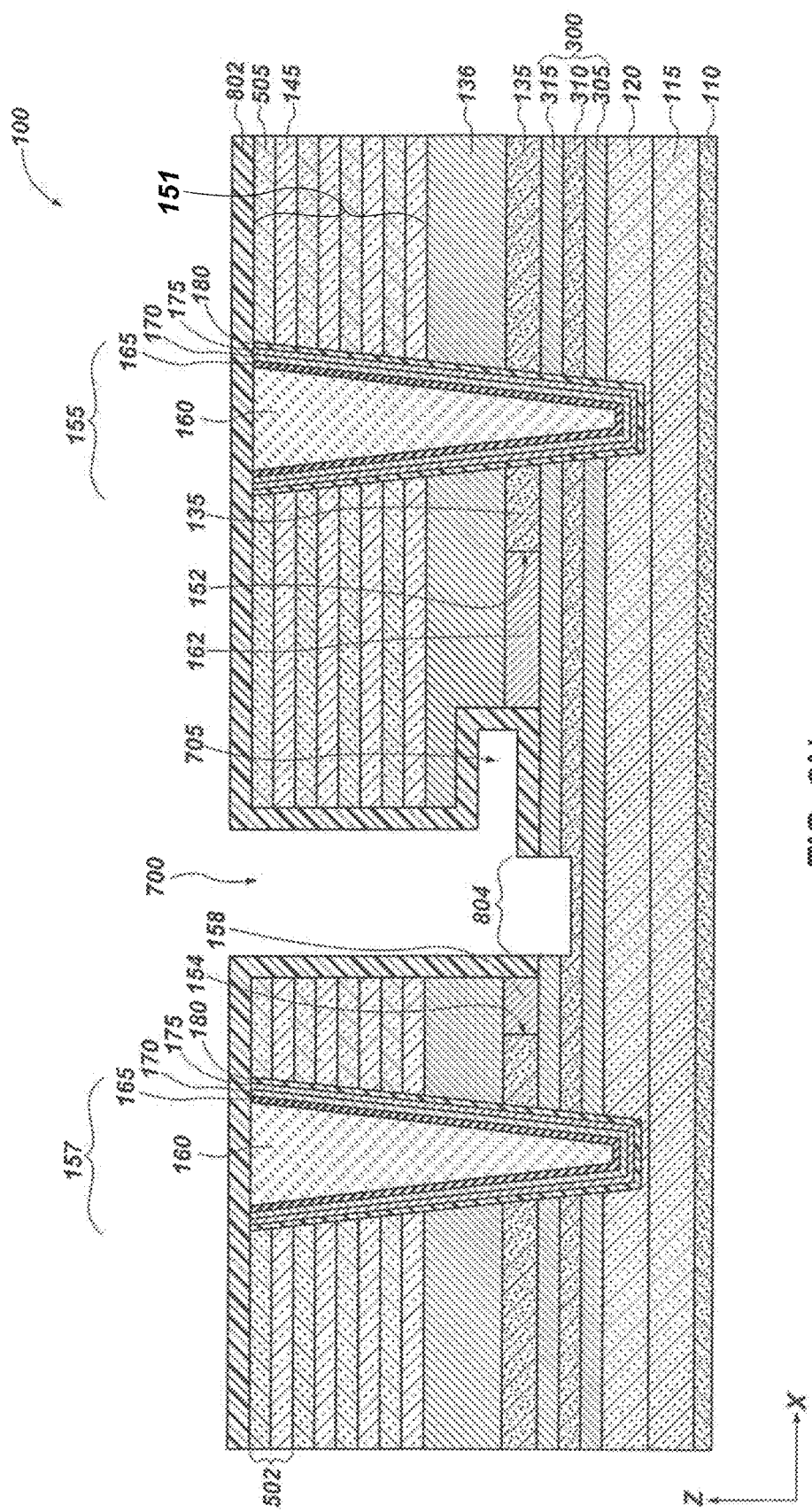
Figure 20:
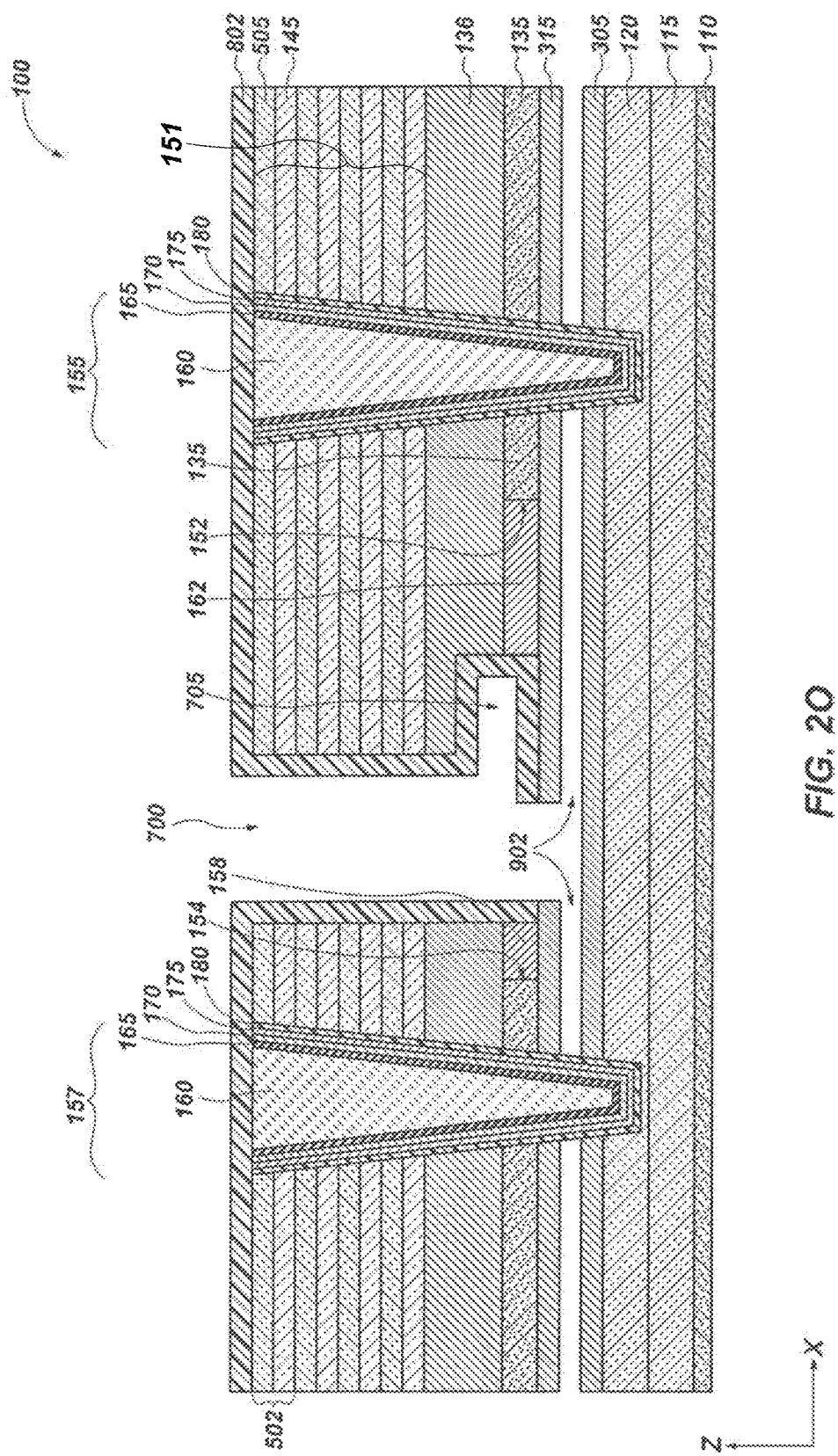
Figure 2P:
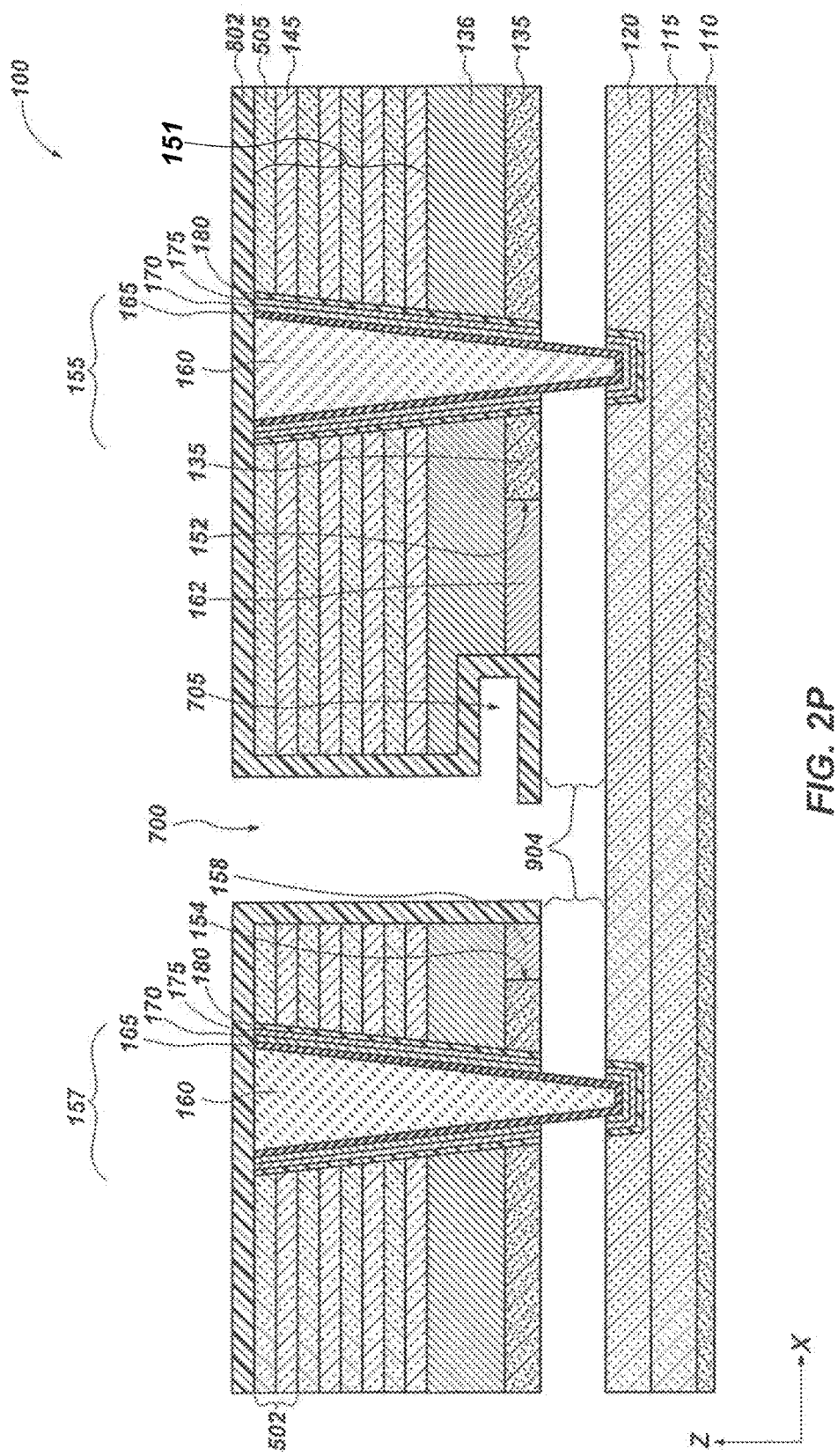
Figure 2Q:
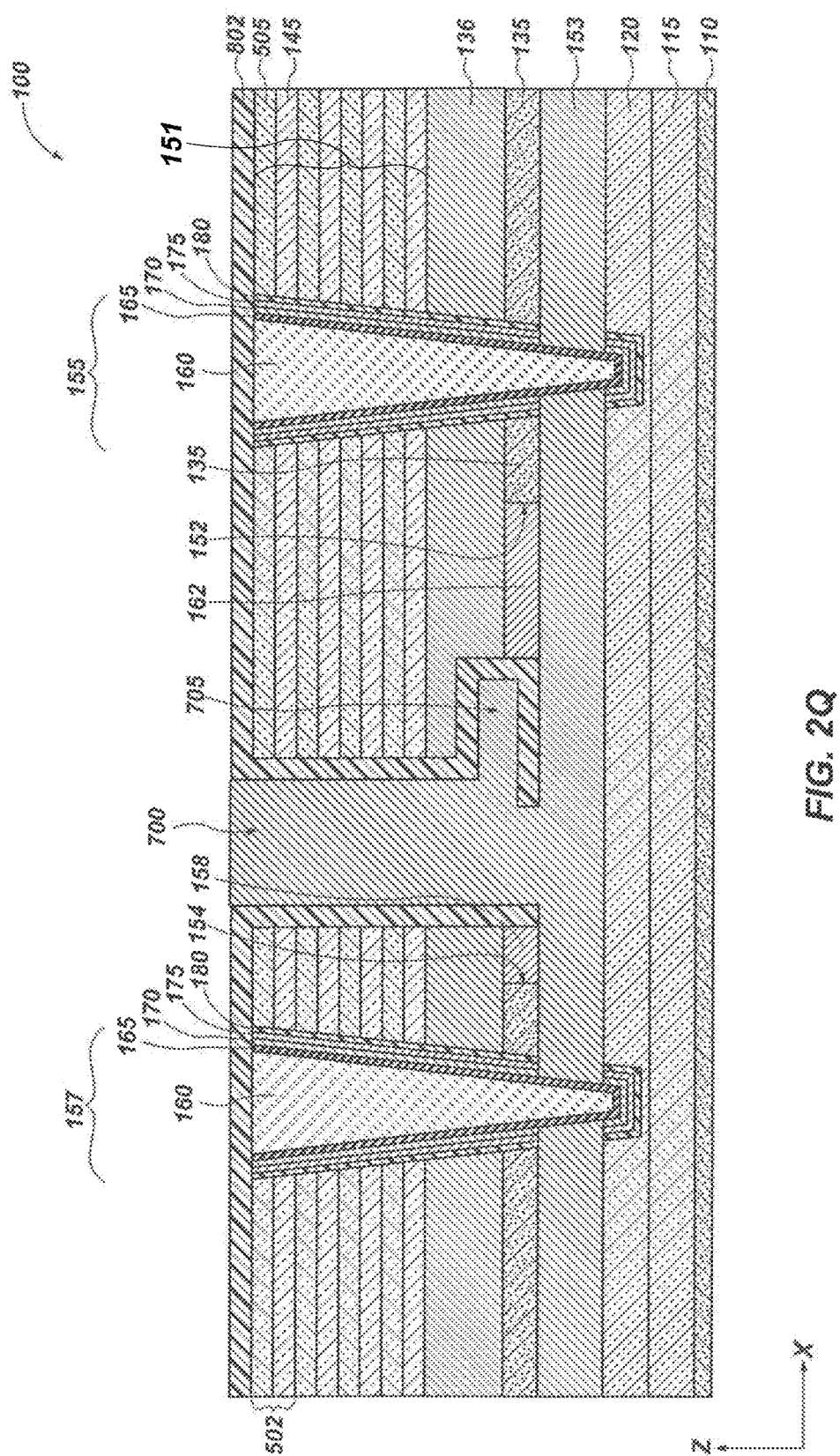
Figure 2R:
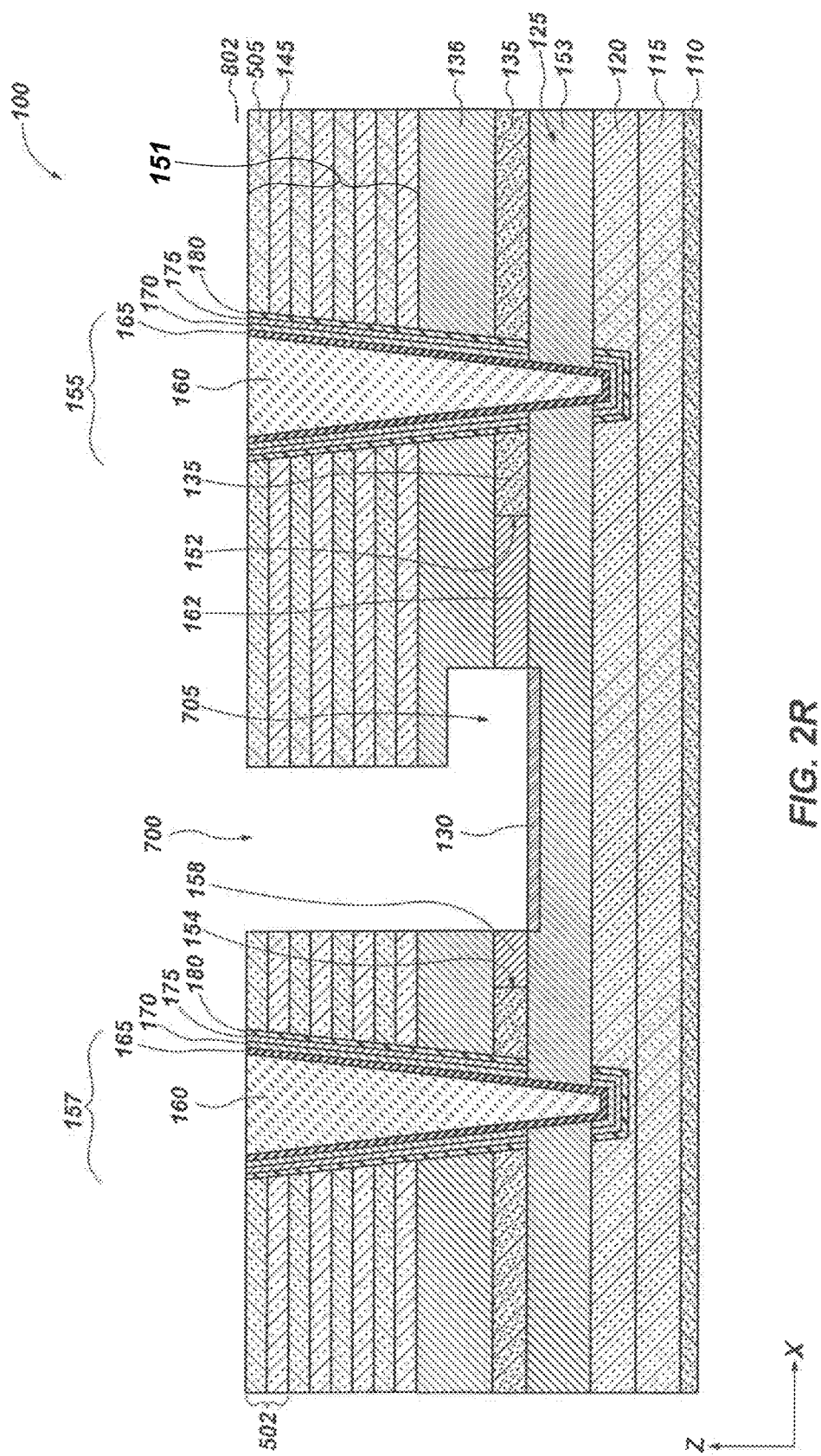

The microelectronic device structure 100 according to embodiments of the disclosure may be formed as illustrated in FIGS. 2A-2R. In particular, FIGS. 2A-2R depict the microelectronic device structure 100 at various stages of formation. As shown in FIG. 2A, the source stack 105 may be formed adjacent to the base material (not shown) and includes one or more conductive materials, with the conductive liner material 110 formed vertically adjacent to the base material, the source material 115 formed vertically adjacent to the conductive liner material 110, and the semiconductor material 120 formed vertically adjacent to the source material 115. In some embodiments, the conductive liner material 110 is formed of and includes titanium nitride, the source material 115 is formed of and includes tungsten silicide ($WSi_x$), and the semiconductor material 120 is formed of and includes a doped polysilicon material. However, the conductive liner material 110, the source material 115, and the semiconductor material 120 may be formed of and include other conductive materials. Each of the conductive liner material 110, source material 115, and semiconductor material 120 may be formed by conventional techniques and to a desired thickness. By way of example only, the conductive liner material 110 may be formed to a thickness of from about 200 Å to about 400 Å, the source material 115 may be formed to a thickness of from about 800 Å to about 1000 Å, and the semiconductor material 120 may be formed to a thickness of from about 2000 Å to about 4000 Å.

A source contact sacrificial structure 300 is formed over the source stack 105, as shown in FIG. 2B. The source contact sacrificial structure 300 may include a first sacrificial material 305, a second sacrificial material 310, and a third sacrificial material 315, each of which may be formed by conventional techniques. Materials of the first sacrificial material 305, the second sacrificial material 310, and the third sacrificial material 315 may be selectively etchable relative to one another and relative to other materials of the microelectronic device structure 100. However, in some embodiments, the first sacrificial material 305 and the third sacrificial material 315 may be the same material (e.g., the same chemical composition) or may be a different material (e.g., a different chemical composition). By way of example only, the first sacrificial material 305, the second sacrificial material 310, and the third sacrificial material 315 may be dielectric materials, such as a silicon oxide material or a silicon nitride material, that are selectively etchable. In some embodiments, the first sacrificial material 305 is a highly conformal silicon dioxide, the second sacrificial material 310 is silicon nitride, and the third sacrificial material 315 is tetraethylorthosilicate (TEOS). In further embodiments, the second sacrificial material 310 is a polysilicon material (e.g., a doped polysilicon material). However, other combinations of dielectric materials and semiconductor materials that are selectively etchable may be used. In addition, the source contact sacrificial structure 300 may be formed of and include two materials or more than three materials. As is discussed in greater detail below, removal of one or more materials of the source contact sacrificial structure 300 provides lateral access for the subsequently formed source contact 125 to contact the pillars 155, 157 (e.g., memory cells).

A location of the source contact sacrificial structure 300 corresponds to the location at which the source contact 125 is ultimately formed, and a total thickness of the as-formed source contact sacrificial structure 300 may be determined by a desired thickness of the source contact 125 (see FIGS. 1A and 1B). Individual thicknesses of each of the first sacrificial material 305, the second sacrificial material 310, and the third sacrificial material 315 may be selected based on the desired thickness of the source contact 125. By way of example only, the first sacrificial material 305 may be formed to a thickness of from about 30 Å to about 400 Å, the second sacrificial material 310 may be formed to a thickness of from about 100 Å to about 300 Å, and the third sacrificial material 315 may be formed to a thickness of from about 30 Å to about 200 Å. The thickness of each of the first sacrificial material 305, the second sacrificial material 310, and the third sacrificial material 315 may be sufficient to protect cell film materials of the pillars 155 and the source stack 105 during subsequently conducted process acts that provide access to the pillars 155 by sequentially removing portions of the cell films.

A semiconductor material 135 may be formed on (e.g., formed vertically adjacent to) the source contact sacrificial structure 300 and may be formed by conventional techniques. The semiconductor material 135 may be include a polysilicon material and may be selectively etchable. A thickness of the semiconductor material 135 may be from about 400 Å to about 1000 Å, such as from about 400 Å to about 600 Å, from about 450 Å to about 550 Å, from about 450 Å to about 700 Å, from about 500 Å to about 700 Å, from about 600 Å to about 800 Å, from about 700 Å to about 900 Å, or from about 800 Å to about 1000 Å. The thickness of the semiconductor material 135 may be selected depending on a desired distance between the source contact 125 and the SGS 185 of the tier stack 140 (see FIGS. 1A and 1B). The thickness of the semiconductor material 135 may be sufficient to separate (e.g., physically separate) the source contact 125 from the SGS 185 by a desired distance. In some embodiments, the thickness of the semiconductor material 135 is about 500 Å.

The insulative cap material 136 may be formed on (e.g., formed vertically adjacent to) the semiconductor material 135 and may be formed by conventional techniques. The insulative cap material 136 may include a conventional dielectric material, such as a silicon oxide material or a silicon nitride material.

Referring still to FIG. 2B, sacrificial pillar structures 138 may extend vertically through at least a portion of the insulative cap material 136, through the semiconductor material 135 and the source contact sacrificial structure 300, and partially through the semiconductor material 120 of the source stack 105. The sacrificial pillar structures 138 may include a liner material 144 defining a recess and an etch stop pillar 142 disposed within the recess. The liner material 144 may include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 144 comprises $SiO_2$. The etch stop pillar 142 may include tungsten or a tungsten-containing material. Furthermore, the etch stop pillar 142 may act as an etch stop during formation of the pillars 155, 157 (e.g., memory cells) (FIG. 1A). The liner material 144 and the sacrificial pillar structures 138 may be formed by conventional techniques.

Referring to FIGS. 2C-2G, a slit sacrificial structure 400 may be formed at least partially within the semiconductor material 135 and the insulative cap material 136. In particular, referring to FIG. 2C, a mask material 146 may be formed over (e.g., vertically on) the insulative cap material 136, and a recess 148 may be formed through the mask material 146, the insulative cap material 136, and the semiconductor material 135. The mask material 146 may be formed via conventional methods, and the recess 148 may be formed by conventional methods. In some embodiments, the recess 148 may be formed to terminate at or within the third sacrificial material 315 of the source contact sacrificial structure 300. In one or more embodiments, the recess 148 may be formed to terminate at or within the third sacrificial material 315 via adjusting one or more of etch chemistry and etch duration. Additionally, the recess 148 may be formed to expose portions of the semiconductor material 135.

As shown in FIG. 2D, the mask material 146 may be removed via any suitable technique (e.g., an abrasive planarization process (e.g., a chemical mechanical planarization (CMP) process), dry etching, wet etching, vapor etching, or ion milling), and portions of the semiconductor material 135 may be removed via one or more selective etching processes. In particular, the semiconductor material 135 may be recessed in the X-direction (e.g., horizontal directions) relative to the insulative cap material 136. In some embodiments, the semiconductor material 135 may be recessed via selective wet etching processes. Furthermore, recessing the semiconductor material 135 relative to the insulative cap material 136 may form first and second lateral edge surfaces 154, 152 of the semiconductor material 135, which are laterally (horizontally) offset from lateral surfaces of the insulative cap material 136 at least partially defining the recess 148.

In one or more embodiments, the semiconductor material 135 may be recessed away from the recess 148 in X-directions (e.g., horizontal directions) by a distance (D) within a range of about 1.0 nm to about 50.0 nm. For example, the semiconductor material 135 may be recessed in X-directions (e.g., horizontal directions) from lateral boundaries of the recess 148 by a distance (D) of about 30.0 nm. As will be discussed in greater detail below, in some embodiments, the semiconductor material 135 may be recessed in X-directions by at least a maximum anticipated, unintentional offset distance of a center axis of a slit 700 (FIG. 2K) to be subsequently formed from a center axis of the slit sacrificial structure 400 in an X-direction. Furthermore, while the semiconductor material 135 is described herein as being recessed in X-directions, the disclosure is not so limited. For example, in some embodiments, the semiconductor material 135 may be recessed more in a first X-direction than in a second, opposite X-direction. Furthermore, in one or more embodiments, the semiconductor material 135 may be recessed in only one X-direction.

Referring still to FIG. 2D, the semiconductor material 135 may be recessed by an amount (e.g., a distance) that leaves at least some semiconductor material 135 between the sacrificial pillar structures 138 laterally adjacent to the recess 148 in the X-direction and the recess 148 itself in the X-direction. In other words, subsequent to the semiconductor material 135 being recessed in the X-directions, portions of the semiconductor material 135 may be present between the sacrificial pillar structures 138 laterally adjacent to the recess 148 in the X-direction and the recess 148 itself. Put another way, recessing the semiconductor material 135 may not expose any portion of the sacrificial pillar structures 138 laterally adjacent to the recess 148 in the X-direction.

Referring to FIG. 2E, an oxide material 156 may be conformally formed (e.g., deposited) over the insulative cap material 136 and within gaps between the insulative cap material 136 and the third sacrificial material 315 of the source contact sacrificial structure 300 formed by recessing the semiconductor material. The oxide material 156 may be formed (e.g., deposited) via any suitable technique. Furthermore, in some embodiments, the oxide material 156 may include one or more of the insulative materials described herein. For example, the oxide material 156 may include silicon oxide ($SiO_x$). As shown in FIG. 2E, in one or more embodiments, the oxide material 156 may be deposited (e.g., conformally deposited) as a liner at least partially over the insulative cap material 136. In additional embodiments, an insulative material other than an oxide material may be utilized instead of or in addition to the oxide material 156.

As shown in FIG. 2F, portions of the oxide material 156 (e.g., middle portion and a liner portion of the oxide material 156) may be removed via conventional methods (e.g., a directional etch) to define a first oxide cap structure 158 vertically between the insulative cap material 136 and the third sacrificial material 315 of the source contact sacrificial structure 300 and laterally adjacent to (e.g., laterally abutting) the first lateral edge surface 154 of the semiconductor material 135. In some embodiments, a lateral edge surface of the first oxide cap structure 158 opposite the first lateral edge surface 154 of the semiconductor material 135 may be at least substantially horizontally aligned with a corresponding lateral surface of the insulative cap material 136 defining the recess 148. Additionally, removing the above-described portions of the oxide material 156 may define a second oxide cap structure 162 vertically between the insulative cap material 136 and the third sacrificial material 315 of the source contact sacrificial structure 300 and laterally adjacent to (e.g., laterally abutting) the second lateral edge surface 152 of the semiconductor material 135. In some embodiments, a lateral edge surface of the second oxide cap structure 162 opposite the second lateral edge surface 152 of the semiconductor material 135 may be at least substantially horizontally aligned with a corresponding lateral surface of the insulative cap material 136 defining the recess 148. Removing the portions of the oxide material 156 also exposes a portion of an upper surface of the third sacrificial material 315.

Referring to FIG. 2G, a liner material 410 may, optionally, be formed within the recess 148 and a remaining volume of the recess 148 filled with an etch stop material 415 to form the slit sacrificial structure 400 mentioned above. The liner material 410, if present, and the etch stop material 415 may be deposited via any suitable technique. Furthermore, excess liner material 410 and/or etch stop material 415 may be removed, such as from upper surfaces of the insulative cap material 136, via conventional techniques such as, for example, e.g., an abrasive planarization process (e.g., a CMP process), dry etching, wet etching, vapor etching, or ion milling. Therefore, the upper surfaces of the insulative cap material 136 are substantially coplanar with upper surfaces of the liner material 410 and the etch stop material 415. As a non-limiting example, the liner material 410 may be a titanium nitride material, and the etch stop material 415 may be tungsten or a tungsten-containing material. The etch stop material 415 may be configured as a plug. In some embodiments, the slit sacrificial structure 400 may be formed of and include one or more materials that are selectively etchable relative to materials of subsequently formed tiers 502 (see FIG. 2H). Alternatively, the slit sacrificial structure 400 may be formed of a single material, such as aluminum oxide, two materials, or more than three materials as long as the material(s) provide the desired etch selectivity and etch stop functions. Furthermore, the slit sacrificial structure 400 may also function as an etch stop during subsequent process acts.

Referring still to FIGS. 2C-2G together, a horizontal location of the slit sacrificial structure 400 may generally horizontally align with a horizontal location at which a slit 700 (see FIG. 2K) may be subsequently formed.

As shown in FIG. 2H, a preliminary stack structure 151 including a vertically alternating (e.g., in the Z-direction) sequence of the insulative structures 145 and sacrificial structures 505 arranged in tiers 502 may be formed on (e.g., formed vertically adjacent to) the insulative cap material 136. In some embodiments, the insulative cap material 136 may be augmented (e.g., thickened) prior to forming the preliminary stack structure 151. As described above, the sacrificial structures 505 may subsequently be replaced with the conductive structures 150 (FIG. 1A) via a replacement gate process to form the tiers 140 (FIG. 1A) of the stack structure 141 (FIG. 1A). In some embodiments, the sacrificial structures 505 may include one or more nitride materials. The tiers 502 of the stack structure 141 may be formed by conventional techniques.

Referring to FIG. 2I, pillar openings 510, 512 may be formed through the tiers 502 and at least partially into the semiconductor material 120, exposing surfaces of the tiers 502, the semiconductor material 135, the source contact sacrificial structure 300, and the semiconductor material 120. The pillar openings 510, 512 may be formed by conventional techniques, such as by conventional photolithography and removal processes. For instance, the portions of the tiers 502, the semiconductor material 135, the source contact sacrificial structure 300, and the semiconductor material 120 may be removed by one or more conventional etch processes, such as a conventional dry etch process. While FIG. 2I illustrates the pillar openings 510, 512 extending partially into the semiconductor material 120, the pillar openings 510, 512 may extend through the semiconductor material 120 and may contact the source material 115.

As shown in FIG. 2J, cell films (e.g., the charge blocking material 180, the charge trap material 175, the tunnel dielectric material 170, and the channel material 165) of the pillars 155, 157 (e.g., memory cells) may be formed within the pillar openings 510, 512. The charge blocking material 180, the charge trap material 175, the tunnel dielectric material 170, and the channel material 165 may be conformally formed in the pillar openings 510, 512 by conventional techniques. The fill material 160 may be formed in remaining volumes of the pillar openings 510, 512 by conventional techniques. In some embodiments, one or more voids may be present in an interior of the fill material 160. Within each of the pillars 155, 157, the charge blocking material 180, the charge trap material 175, the tunnel dielectric material 170, the channel material 165, and the fill material 160 may be positioned in the foregoing order from an outermost material to an innermost material relative to an axial centerline of each of the pillars 155, 157.

The charge blocking material 180 may be formed of and include a dielectric material. By way of example only, the charge blocking material 180 may be one or more of an oxide (e.g., silicon dioxide), a nitride (silicon nitride), and an oxynitride (silicon oxynitride), or another material. In some embodiments, the charge blocking material 180 is silicon dioxide.

The charge trap material 175 may be formed of and include at least one memory material and/or one or more conductive materials. The charge trap material 175 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material 175 is silicon nitride.

The tunnel dielectric material 170 may include one or more dielectric materials, such as one or more of a silicon nitride material or a silicon oxide material. In some embodiments, the tunnel dielectric material 170 is a so-called "ONO" structure that includes silicon dioxide, silicon nitride, and silicon dioxide.

The channel material 165 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel material 165 is polysilicon, such as a doped polysilicon. The channel material 165 may be configured as a so-called doped hollow channel (DHC) or other configuration. The fill material 160 may be a dielectric material, such as silicon dioxide.

Referring to FIGS. 2K and 2L, a portion of the tiers 502, the insulative cap material 136, and at least a portion of the slit sacrificial structure 400 may be removed to form a slit 700 through the tiers 502 and through the semiconductor material 135. As discussed in more detail below, the replacement gate process used to remove the sacrificial structures 505 and replace the sacrificial structures 505 with conductive structures 150 may be conducted through the slit 700. Additionally, a remainder of the slit sacrificial structure 400 may be removed (e.g., exhumed) to form a lower opening 705 within the insulative cap material 136. In some embodiments, the slit sacrificial structure 400 may be substantially completely removed. Furthermore, while the remainder of the slit sacrificial structure 400 is removed (e.g., exhumed) to form the lower opening within the insulative cap material 136 and through the semiconductor material 135, the first and second oxide cap structures 158, 162 may protect the semiconductor material 135 from being further removed (e.g., exhumed). In some embodiments, a center line of the slit 700 may be offset from a center line of the slit sacrificial structure 400. As a result, in some embodiments, a portion of one or more of the first and second oxide cap structures 158, 162 may be removed while forming the slit 700. However, at least a portion of each of the first and second oxide cap structures 158, 162 may remain adjacent to a respective portion of the semiconductor material 135. As a result, while the slit 700 and the lower opening 705 are formed, the first and second oxide cap structures 158, 162 may cap the semiconductor material 135 and protect the semiconductor material 135 from removal processes. Accordingly, the first and second oxide cap structures 158, 162 may assist in maintaining a presence and structure of the semiconductor material 135 within the microelectronic device structure 100. As is discussed in greater detail below, the first and second oxide cap structures 158, 162 may also protect the semiconductor material 135 during later removal processes described herein. The slit 700 and the lower opening 705 may expose the source contact sacrificial structure 300, such as an upper surface of the third sacrificial material 315.

Referring still to FIGS. 2K and 2L, the tiers 502, the insulative cap material 136, the slit sacrificial structure 400, and any removed portions of one or more of the first and second oxide cap structures 158, 162 may be removed via one or more etch processes, such as by using conventional etch conditions. If a single etch process is utilized, the tiers 502, the slit sacrificial structure 400, the insulative cap material 136, and any removed portions of one or more of the first and second oxide cap structures 158, 162 may be substantially removed by the single etch process. If more than one etch process is utilized, the etch stop material 415 of the slit sacrificial structure 400 may function as an etch stop during the first etch process to form the slit 700 and a second etch process may be conducted to remove a remainder of the slit sacrificial structure 400. For convenience, the slit 700 and the lower opening 705 are collectively referred to hereinafter as the slit 700. While FIGS. 2K and 2L illustrate the slit 700 as extending through the tiers 502 and the semiconductor material 135 to the upper surface of the third sacrificial material 315, the slit 700 may extend partially into the third sacrificial material 315.

Referring still to FIG. 2K, in some embodiments, the tiers 502, the insulative cap material 136, and the first and second oxide cap structures 158, 162 may etch at a faster rate than the material of the slit sacrificial structure 400. As a result, during formation of the slit 700 and due to the slit 700 partially missing the slit sacrificial structure 400, the remaining portion of the slit sacrificial structure 400 may exhibit a stepped profile or other irregular profile may be formed at a lateral side of the slit sacrificial structure 400 where the slit sacrificial structure 400 was exposed to removal processes utilized to form the slit 700. As shown in FIG. 2M, subsequent to forming the slit 700, a slit liner 802 may be formed on exposed surfaces of the tiers 502, the insulative cap material 136, the first and second oxide cap structures 158, 162, and the third sacrificial material 315 within the slit 700. The slit liner 802 may be conformally formed by conventional techniques such that a portion of the slit 700 remains open (e.g., unoccupied). The slit liner 802 may be formed of and include a dielectric material, a semiconductive material, or a conductive material. In some embodiments, the slit liner 802 is undoped polysilicon.

Referring to FIG. 2N, a portion of the slit liner 802 may be removed from a bottom surface of the slit 700, exposing the third sacrificial material 315 of the source contact sacrificial structure 300, which may also be removed to form an opening 804 exposing the second sacrificial material 310 of the source contact sacrificial structure 300. The slit liner 802 and the third sacrificial material 315 at the bottom surface of the slit 700 may be removed by conventional techniques (e.g., a punch etch). In some embodiments, a portion of the second sacrificial material 310 of the source contact sacrificial structure 300 may be removed during a process of removing the portion of the slit liner 802 and the third sacrificial material 315.

To provide access to the pillars 155, 157, the source contact sacrificial structure 300 and portions of the cell films (charge blocking material 180, charge trap material 175, tunnel dielectric material 170) are sequentially removed, as shown in FIGS. 2O and 2P. The source contact sacrificial structure 300 may be removed while a majority of the semiconductor material 135 remains intact by selecting the etch conditions used to remove the source contact sacrificial structure 300. In other words, the semiconductor material 135 is substantially resistant to the etch conditions used to remove the source contact sacrificial structure 300.

The second sacrificial material 310 may be removed through the slit 700, and a source contact opening 902 may be formed. As described below, the size of the source contact opening 902 is sequentially increased to provide access to the pillars 155, 157 following the removal of the source contact sacrificial structure 300. The second sacrificial material 310 of the source contact sacrificial structure 300 may be selectively removed without substantially removing the first and third sacrificial materials 305, 315 or the charge blocking material 180. The second sacrificial material 310 may be selectively etched by conventional techniques, such as by conventional etch conditions, which are selected depending on the chemical composition of the second sacrificial material 310. Since the first sacrificial material 305, the third sacrificial material 315, and the charge blocking material 180 may be similar materials and exhibit slower etch rates than the etch rate of the second sacrificial material 310, the second sacrificial material 310 is substantially removed relative to the first sacrificial material 305, the third sacrificial material 315, and the charge blocking material 180. By way of example only, if the first sacrificial material 305, the third sacrificial material 315, and the charge blocking material 180 are silicon oxide materials and the second sacrificial material 310 is a silicon nitride material, an etch chemistry formulated to remove silicon nitride may be used, such as a phosphoric acid-based etch chemistry. The semiconductor material 135 is not exposed to (e.g., is protected from) the etch conditions by the slit liner 802, the tiers 502, the first and second oxide cap structures 158, 162, and the third sacrificial material 315.

Referring specifically to FIG. 2P, portions of the charge blocking material 180, portions of the charge trap material 175, portions of the tunnel dielectric material 170, the first sacrificial material 305, and the third sacrificial material 315 may be selectively removed via one or more etching processes without substantially removing the slit liner 802 or removing portions of the semiconductor material 135. Removing the portions of the charge blocking material 180, the portions of the charge trap material 175, the portions of the tunnel dielectric material 170, the first sacrificial material 305, and the third sacrificial material 315 may form a source contact opening 904, which also exposes a bottom horizontal surface of the semiconductor material 135 and exposes portions of the charge blocking material 180, portions of the charge trap material 175, and portions of the tunnel dielectric material 170. The bottom surface of the semiconductor material 135 may be substantially coplanar with a bottom surface of the slit liner 802 and bottom surfaces of the first and second oxide cap structures 158, 162. Furthermore, one or more of the bottom horizontal surfaces of the charge blocking material 180, the bottom horizontal surfaces of the charge trap material 175, and the bottom horizontal surfaces of the tunnel dielectric material 170 may be recessed relative to (e.g., not coplanar with) the bottom surfaces of the semiconductor material 135, the first and second oxide cap structures 158, 162 and the slit liner 802.

The semiconductor material 135 may function as an offset between the source stack 105 and the tiers 140 during the fabrication of the microelectronic device structures 100 (see FIGS. 1A and 1B). Since the first sacrificial material 305, the second sacrificial material 310, and the third sacrificial material 315 of the source contact sacrificial structure 300 provide protection to (e.g., masking of) various materials during the process acts indicated in and described in regard to FIGS. 2C-2P, the initial thicknesses of the first sacrificial material 305, the second sacrificial material 310, and the third sacrificial material 315 are selected to be sufficiently thick to survive the etch conditions used to provide lateral access to the channel material 165 of the pillars 155, 157. The source contact opening 904 may exhibit a height, which corresponds to a thickness of the source contact 125 ultimately formed in the source contact opening 904. The thickness of the source contact 125 (see FIGS. 1A and 1B) may be greater than or equal to a combined thickness of the materials of the as-formed source contact sacrificial structure 300 (see FIG. 2G). By determining the desired thickness of the source contact 125, the thickness of the source contact sacrificial structure 300 may be selected.

While the first sacrificial material 305, the second sacrificial material 310, and the third sacrificial material 315 have been removed (e.g., are not present) in the view depicted in FIG. 2P, these materials of the source contact sacrificial structure 300 may be present in other locations (not shown) of the microelectronic device structure 100, such as in portions of the microelectronic device structure 100 distal to the slit 700. The source contact sacrificial structure 300 may be present (e.g., visible), for example, in peripheral regions of the microelectronic device structure 100. In other words, the source contact sacrificial structure 300 may be positioned between the semiconductor material 120 and the semiconductor material 135 in the other portions of the microelectronic device structure 100. Therefore, although the source contact 125 is present between the semiconductor material 135 and the source stack 105 of the microelectronic device structure 100 in the perspectives shown in FIGS. 1A and 1B, the other portions of the microelectronic device structure 100 include the source contact sacrificial structure 300 between the semiconductor material 135 and the source stack 105.

The source contact opening 904 may provide access (e.g., lateral access) to the pillars 155, 157 following the substantially complete removal of the source contact sacrificial structure 300, which exposes the channel materials 165 of the pillars 155, 157. As mentioned briefly above, while FIG. 2P illustrates the exposed horizontal surfaces of the tunnel dielectric material 170 and the charge trap material 175 proximal to the semiconductor material 135 as being substantially coplanar with each other and with the exposed horizontal surfaces of the semiconductor material 135, the exposed horizontal surfaces of the charge trap material 175 may be recessed relative to the exposed horizontal surfaces of the tunnel dielectric material 170 depending on the etch conditions used in the acts described above in regard to FIGS. 2N-2P. The exposed horizontal surfaces of the charge trap material 175 may be recessed to a point intermediate to that of the exposed horizontal surfaces of the charge blocking material 180 and the tunnel dielectric material 170. The exposed horizontal surfaces of the tunnel dielectric material 170 may also be recessed relative to the exposed horizontal surfaces of the semiconductor material 135 and of the charge trap material 175. Therefore, the size of the source contact opening 904 may be further increased proximal to the pillars 155, 157.

As shown in FIG. 2Q, a conductive material 153 of the source contact 125 is formed within the source contact opening 904. The conductive material 153 may be conformally formed in the source contact opening 904, substantially completely filling the source contact opening 904, and filling at least a portion of the slit 700. In some embodiments, the conductive material 153 is polysilicon, such as N+ doped polysilicon. In other embodiments, the conductive material 153 may include one or more of any of the conductive materials described herein. The conductive material 153 may be formed at a thickness of from about 500 Å to about 2000 Å, such as from about 700 Å to about 1500 Å, from about 700 Å to about 1800 Å, from about 800 Å to about 1500 Å, from about 800 Å to about 1800 Å, or from about 800 Å to about 2000 Å. The conductive material 153 extends in a vertical direction between the semiconductor material 135 and the semiconductor material 120 and contacts the pillars 155. In some embodiments, an oxidation act may be conducted to activate dopants in the conductive material 153 so that the conductive material 153 is substantially continuous and includes few to no holes, voids, or seams.

As shown in FIG. 2R, the conductive material 153 and the slit liner 802 may be removed from the slit 700 while the conductive material 153 remains in the source contact opening 904, which forms the source contact 125. For example, the conductive material 153 may be removed from the slit 700 without removing the conductive material 153 from the source contact opening 904. The conductive material 153 may be removed by conventional techniques. The resulting source contact 125 extends in a vertical direction between the semiconductor material 135 and the semiconductor material 120 and contacts (e.g., directly contacts) the channel material 165, the tunnel dielectric material 170, the charge trap material 175, and the charge blocking material 180 of the pillars 155, 157. The source contact 125 directly contacts a lower surface of the semiconductor material 135 and an upper surface of the semiconductor material 120. The source contact 125 also directly contacts upper and lower horizontal surfaces of the tunnel dielectric material 170, the charge trap material 175, and the charge blocking material 180 and sidewalls of the channel material 165. The source contact 125 is separated from the tiers 502 by the semiconductor material 135 and the insulative cap material 136. In some embodiments, a portion of the source contact 125 exposed through the slit 700 may be removed, recessing the source contact 125 adjacent to (e.g., under) the slit 700, and/or oxidized by conventional techniques to form the oxidized portion 130 of the source contact 125.

Subsequent to the acts described in FIGS. 2A-2R, additional process acts may be performed to form the microelectronic device structure 100 as shown in FIGS. 1A and 1B. The additional process acts may be conducted by conventional techniques. By way of example only, the replacement gate process is conducted to remove the sacrificial structures 505 of the tiers 502 and to form the conductive structures 150 of the tiers 140 of the stack structure 141 according to any of the methods described above. Furthermore, while FIGS. 1A-2R illustrate the formation of the microelectronic device structure 100 by the replacement gate process, methods according to embodiments of the disclosure may be used to form the microelectronic device structure 100 via a floating gate process. Additionally, one or more materials 195 may be formed in the slit 700, such as a single dielectric material, a combination of a dielectric material and silicon, or a combination of a dielectric material and a conductive material.

Referring to FIGS. 1A-2R together, the method of forming the first and second oxide cap structures 158, 162 to cap (e.g., protect) lateral sides of the semiconductor material 135 described herein provides advantages over conventional methods. Furthermore, the structure of the microelectronic device structures 100 described herein provides advantages over conventional structures. In particular, by capping lateral sides of the semiconductor material 135 with the first and second oxide cap structures 158, 162, the semiconductor material 135 is protected from being removed (e.g., exhumed) while sacrificial structures are removed during formation of a slit utilized to form lateral contacts with pillars (e.g., memory cells) and to perform replacement gate processes. Additionally, capping lateral sides of the semiconductor material 135 with the first and second oxide cap structures 158, 162 provides a margin of error in formation of the slit. For example, as noted above, in some instances, limits on microelectronic device structure fabrication processes may result in the slit at least partially missing etch stop structures (e.g., being at least partially offset from an etch stop structure) intended to at least partially stop an etch forming the slit. However, having the first and second oxide cap structures 158, 162 on either side of the etch stop structure enables the slit to at least partially miss the etch stop structure while still protecting the semiconductor material 135 from unintentionally being removed during fabrication processes.

Furthermore, by capping lateral sides of the semiconductor material 135 with the first and second oxide cap structures 158, 162, access can be achieved through the slit to sacrificial materials (e.g., first, second, and third sacrificial materials 305, 310, 315) (e.g., access to sacrificial materials can be achieved via a punch etch) without risk of unintentionally removing portions of the semiconductor material 135. Thus, the integrity of the semiconductor material 135 within the microelectronic device structure 100 may be maintained. Moreover, by preventing unintentional removal of the semiconductor material 135, the methods and structures described herein provide one or more of improved performance, reliability, and durability, lower costs, as compared to conventional structures, conventional devices, and conventional systems.

Figure 3A:
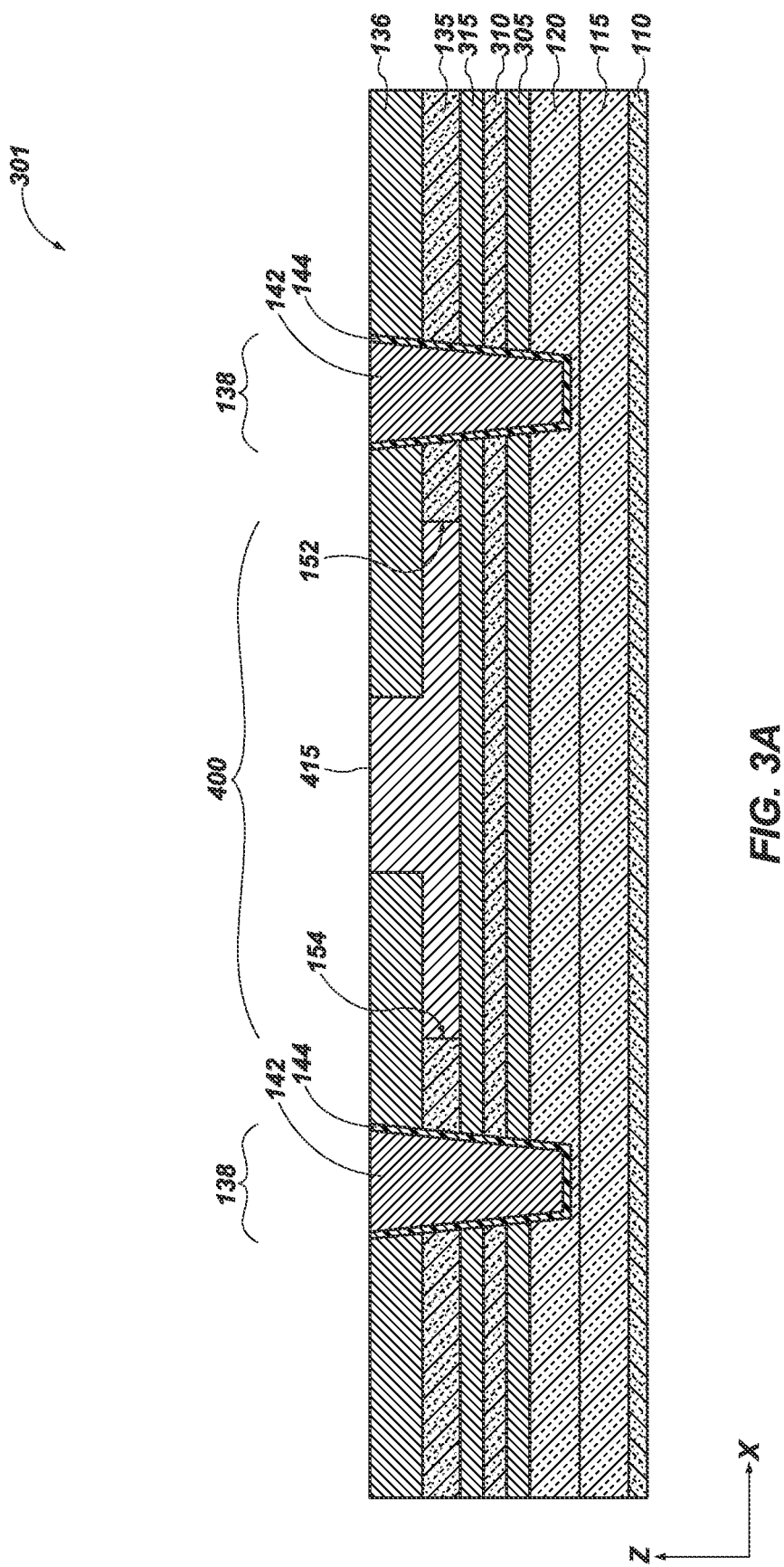
FIGS. 3A-3D are cross-sectional, elevational, schematic illustrations during various processing acts to fabricate a microelectronic device structure in accordance with additional embodiments of the disclosure.

FIGS. 3A-3D show a method of forming a microelectronic device structure 301 according to one or more additional embodiments of the present disclosure. In particular, the method may include the acts described above in regard to FIGS. 2A-2D; however, as shown in FIG. 3A, gaps between the insulative cap material 136 and the third sacrificial material 315 of the source contact sacrificial structure 300, formed by recessing the semiconductor material 135, may be at least substantially filled by the etch stop material 415 instead of an oxide material. In some embodiments, as described above, the etch stop material 415 may include tungsten or a tungsten-containing material. The etch stop material 415 may be configured as a plug and may form a slit sacrificial structure 400. In some embodiments, the slit sacrificial structure 400 may be formed of and include one or more materials that are selectively etchable relative to materials of subsequently formed tiers 502 (see FIG. 3B). Alternatively, the slit sacrificial structure 400 may be formed of a single material, such as aluminum oxide, two materials, or more than three materials as long as the material(s) provide the desired etch selectivity and etch stop functions. Furthermore, the slit sacrificial structure 400 may also function as an etch stop during subsequent process acts. Moreover, in some embodiments, a liner material may be conformally formed within the recess 148 (FIG. 2D), and the etch stop material 415 may be deposited within a remaining volume of the recess 148, similar to the acts described above in regard to FIGS. 2D-2G.

Referring still to FIG. 3A, the etch stop material 415 may extend into the gaps between the insulative cap material 136 and the source contact sacrificial structure 300 and may be laterally adjacent to (e.g., laterally abutting) the first lateral edge surface 154 of the semiconductor material 135 and laterally adjacent to (e.g., laterally abutting) the second lateral edge surface 152 of the semiconductor material 135.

Figure 3B:
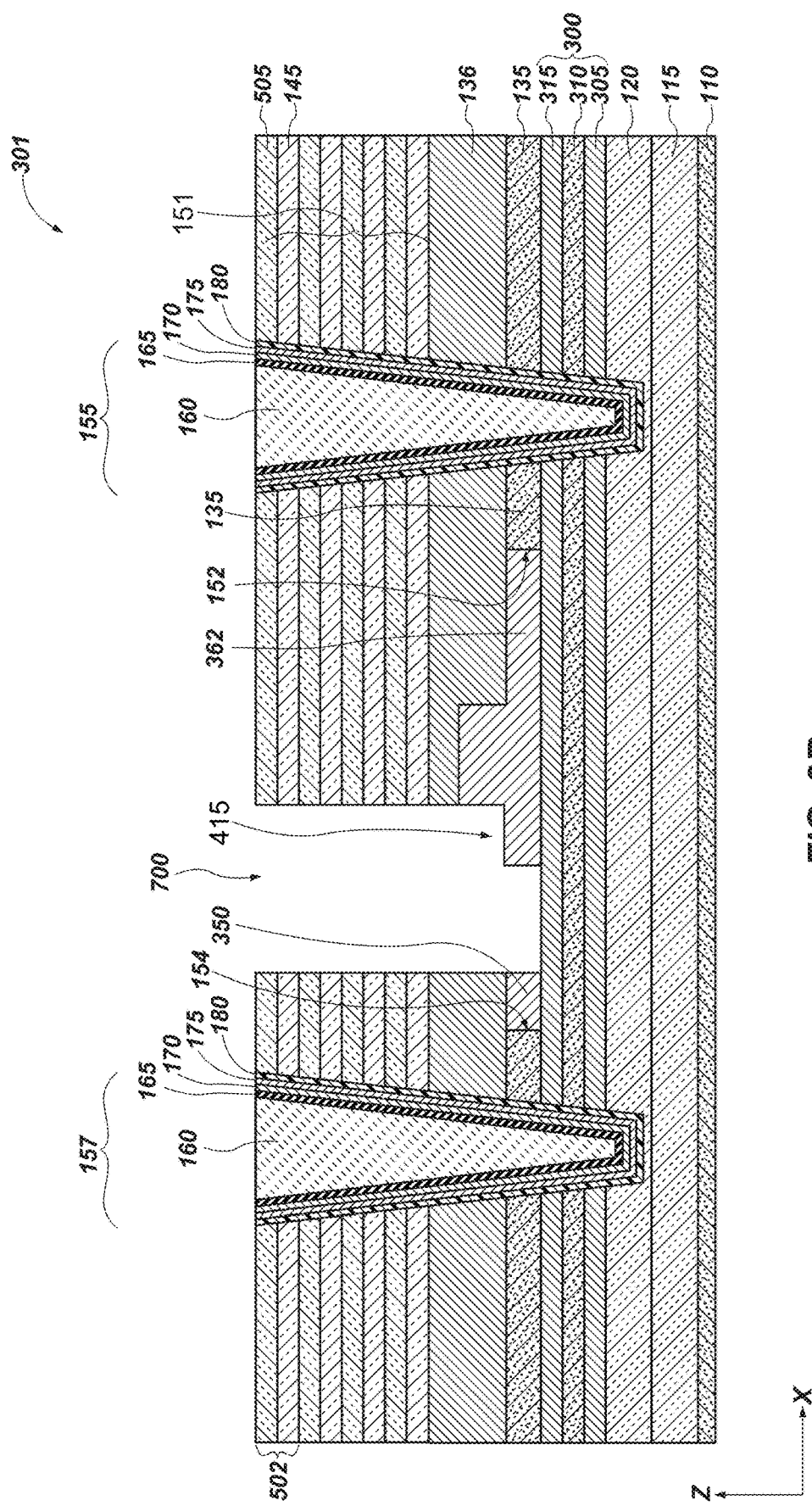

Additionally, the acts described above in regard to FIGS. 2H-2K may be performed in regard to the microelectronic device structure 301. As a result, and as shown in FIG. 3B, forming the slit 700 in the microelectronic device structure 301 may leave portions 350, 362 of the etch stop material 415 (referred to hereinafter as "etch stop caps 350, 362") abutting the first and second lateral edge surfaces 154, 152 of the semiconductor material 135 and in similar positions to the first and second oxide cap structures 158, 162 described above in regard to FIGS. 2A-2R. Furthermore, the etch stop caps 350, 362 may cap the semiconductor material 135 and may provide the same protections to the semiconductor material 135 as the first and second oxide cap structures 158, 162 described above in regard to FIGS. 2A-2R.

Figure 3C:
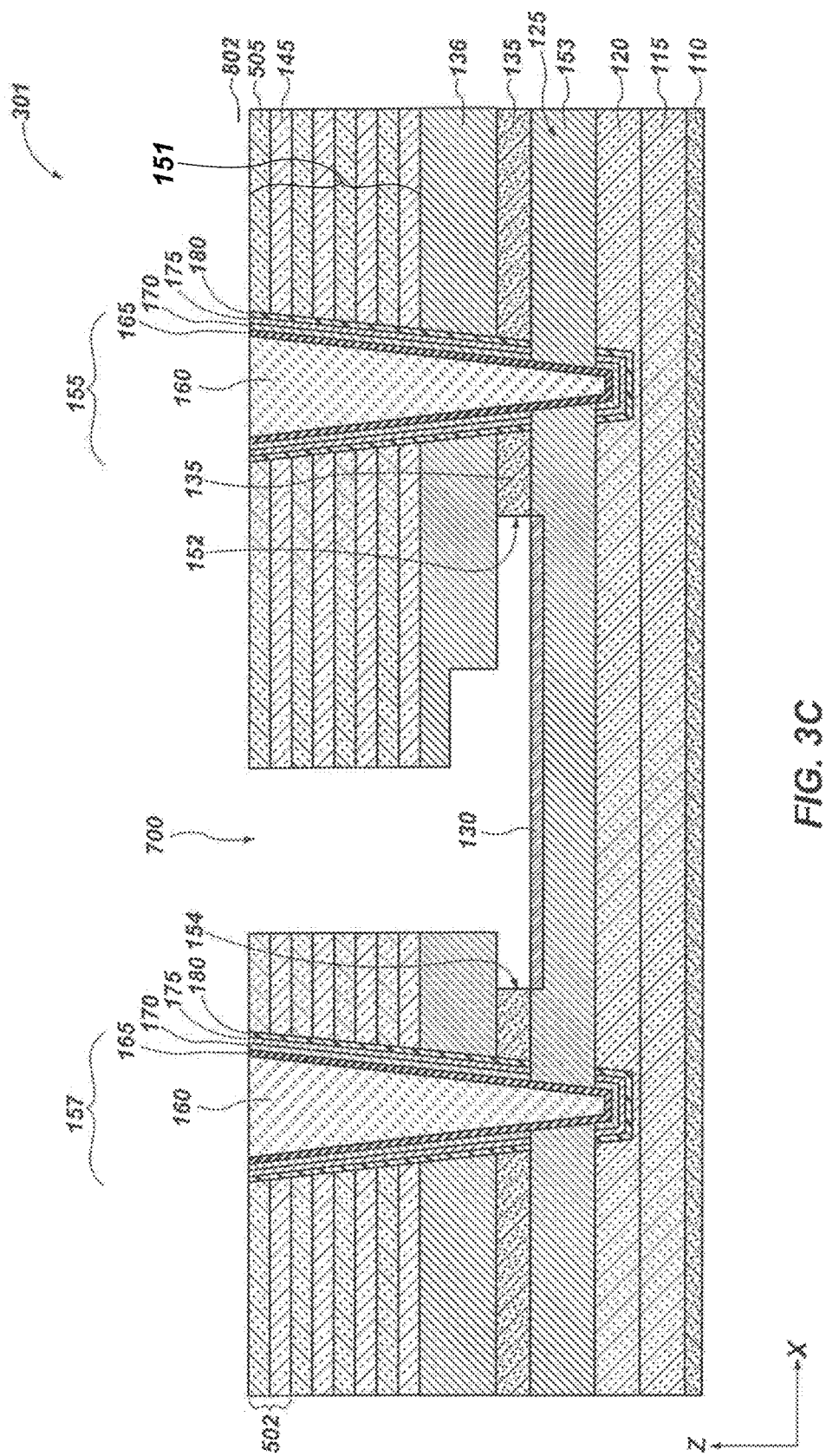

Subsequent to the acts described in regard to FIG. 3B, the acts described above in regard to FIGS. 2K-2R may be performed in regard to the microelectronic device structure 301 to arrive at the microelectronic device structure 301 depicted in FIG. 3C. As depicted in FIG. 3C, the etch stop caps 350, 362 may be ultimately removed via one or more of the removal processes described in regard to FIG. 2R.

Figure 3D:
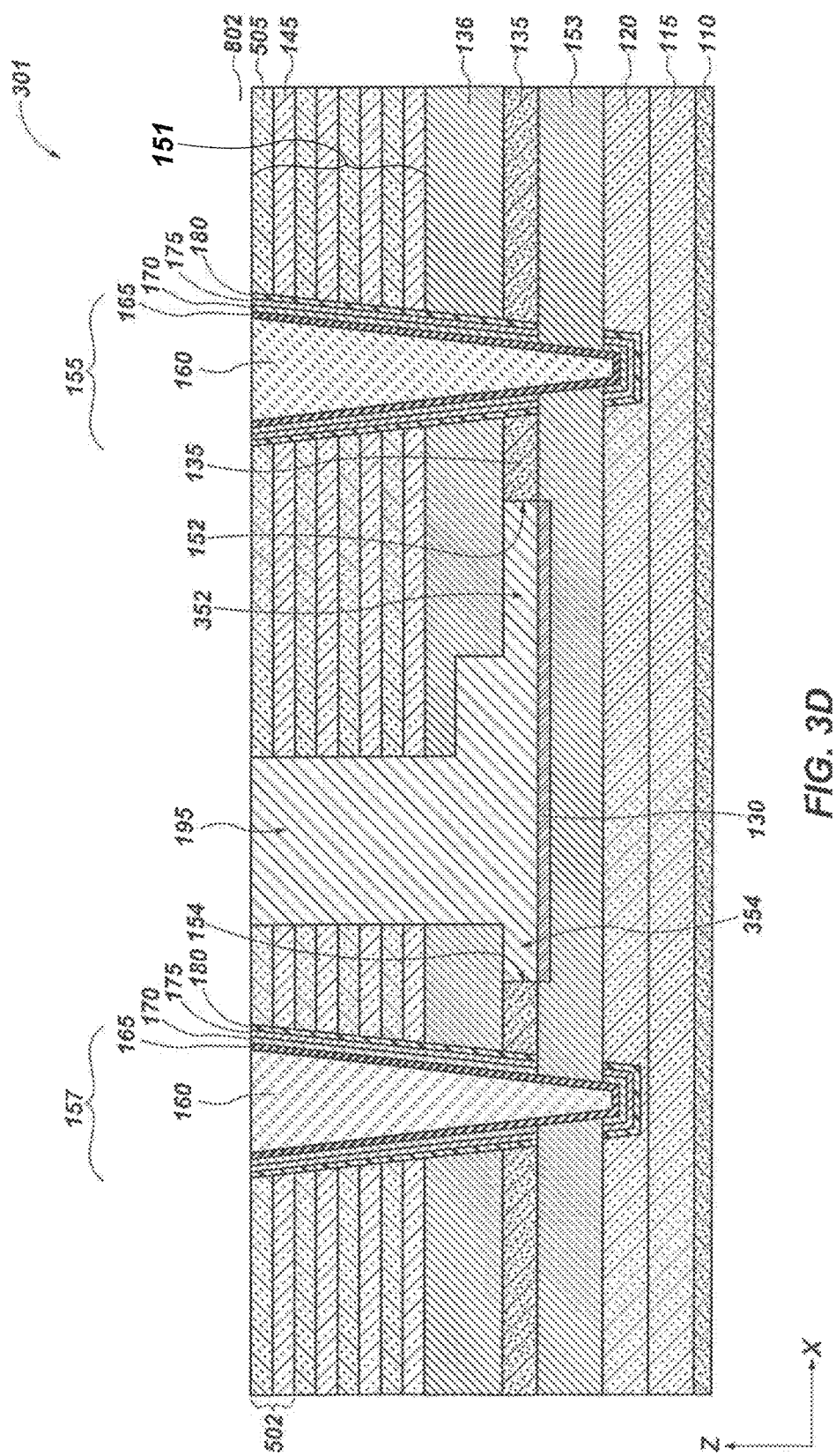

Referring now to FIG. 3D, the one or more materials 195 may be formed in the slit 700, such as a single dielectric material, a combination of a dielectric material and silicon, or a combination of a dielectric material and a conductive material. Furthermore, the one or more materials 195 may define a first portion 354 abutting the first lateral edge surface 154 of the semiconductor material 135 and a second portion 352 abutting the second lateral edge surface 152 of the semiconductor material 135. Furthermore, regardless of material of the first and second portions 354, 352, the first and second portions 354, 352 may be distinguishable from the semiconductor material 135 via chemical composition and/or crystalline structure.

The methods and structures described in regard to FIGS. 3A-3D may provide similar advantages to the advantages described above in regard to FIGS. 2A-2R.

One or more microelectronic device structures 100, 301 according to embodiments of the disclosure may be present in an apparatus or in an electronic system. The microelectronic device structures 100, 301, the apparatus including the one or more microelectronic device structures 100, 301, or the electronic system including the one or more microelectronic device structures 100, 301 may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the microelectronic device structure 100, 301 or after the microelectronic device structure 100, 300 has been fabricated. By way of example only, one or more of the additional components may be formed before or after the cell films of the pillars 155, 157 are formed, while other additional components may be formed after the microelectronic device structure 100, 300 has been fabricated. The additional components may be present in locations of the microelectronic device structure 100, 301 or the apparatus that are not depicted in the perspectives of FIGS. 1A-2R.

Embodiments of the disclosure include a microelectronic device including a source stack, a source contact vertically adjacent to the source stack, a semiconductor material vertically adjacent to the source contact, tiers of alternating conductive materials and dielectric materials vertically adjacent to the semiconductor dielectric material, a dielectric structure within a slot structure and extending through the tiers of the microelectronic device to the source contact of the microelectronic device, oxide cap structures laterally between the semiconductor material and the dielectric structure, and pillars extending through the tiers, the semiconductor material, and the source contact and into the source stack.

One or more embodiments of the disclosure include a microelectronic device having a semiconductor material between a stack structure and a source contact, the stack structure comprising a vertically alternating sequence of conductive structures and insulating structures arranged in tiers, a dielectric-filled opening vertically extending into the stack structure and through the semiconductor material, oxide cap structures between the dielectric-filled opening and the semiconductor material, and memory pillars extending through the tiers, the semiconductor material, and the source contact, the source contact directly contacting a channel of the memory pillars.

Embodiments of the disclosure include a method of forming a microelectronic device, the method may include forming a source contact sacrificial structure vertically adjacent to a source stack, forming a semiconductor material vertically adjacent to the source contact sacrificial structure, forming an insulative cap material vertically adjacent to the semiconductor material, forming an vertical recess through the insulative cap material and the semiconductor material, recessing the semiconductor material relative to the insulative cap material laterally to define vertical gaps between the source contact sacrificial structure and the insulative cap material on opposing lateral sides of the vertical recess, filling the vertical gaps with an oxide material and forming a slit sacrificial structure within the vertical recess to form at least one oxide cap structure laterally adjacent to the semiconductor material and laterally between the semiconductor material and the slit sacrificial structure, forming tiers vertically adjacent to the insulative cap material, forming memory pillars through the tiers and into the source stack, forming a slit through the tiers and removing the slit sacrificial structure to expose the source contact sacrificial structure, the at least one oxide cap structure remaining laterally between the slit and the semiconductor material, selectively removing the source contact sacrificial structure to form a source contact opening, and forming a conductive material in the source contact opening to form a source contact extending laterally and contacting the memory pillars.

Additional embodiments of the disclosure include an electronic system having an input device, an output device, a processor device operably coupled to the input device and to the output device, and one or more memory devices operably coupled to the processor device and comprising one or more microelectronic devices. The one or more microelectronic devices may include a source contact vertically adjacent to a source stack, a dielectric-filled slot structure vertically adjacent to the source contact, the dielectric-filled slot structure extending through tiers of alternating conductive materials and insulative materials, a semiconductor material vertically adjacent to the source contact and laterally spaced from the dielectric-filled slot structure on opposing lateral sides of the dielectric-filled slot structure, oxide cap structures laterally between the dielectric-filled slot structure and the semiconductor material, and memory pillars extending through the tiers, the semiconductor material, and the source contact and partially into the source stack.

Figure 4:
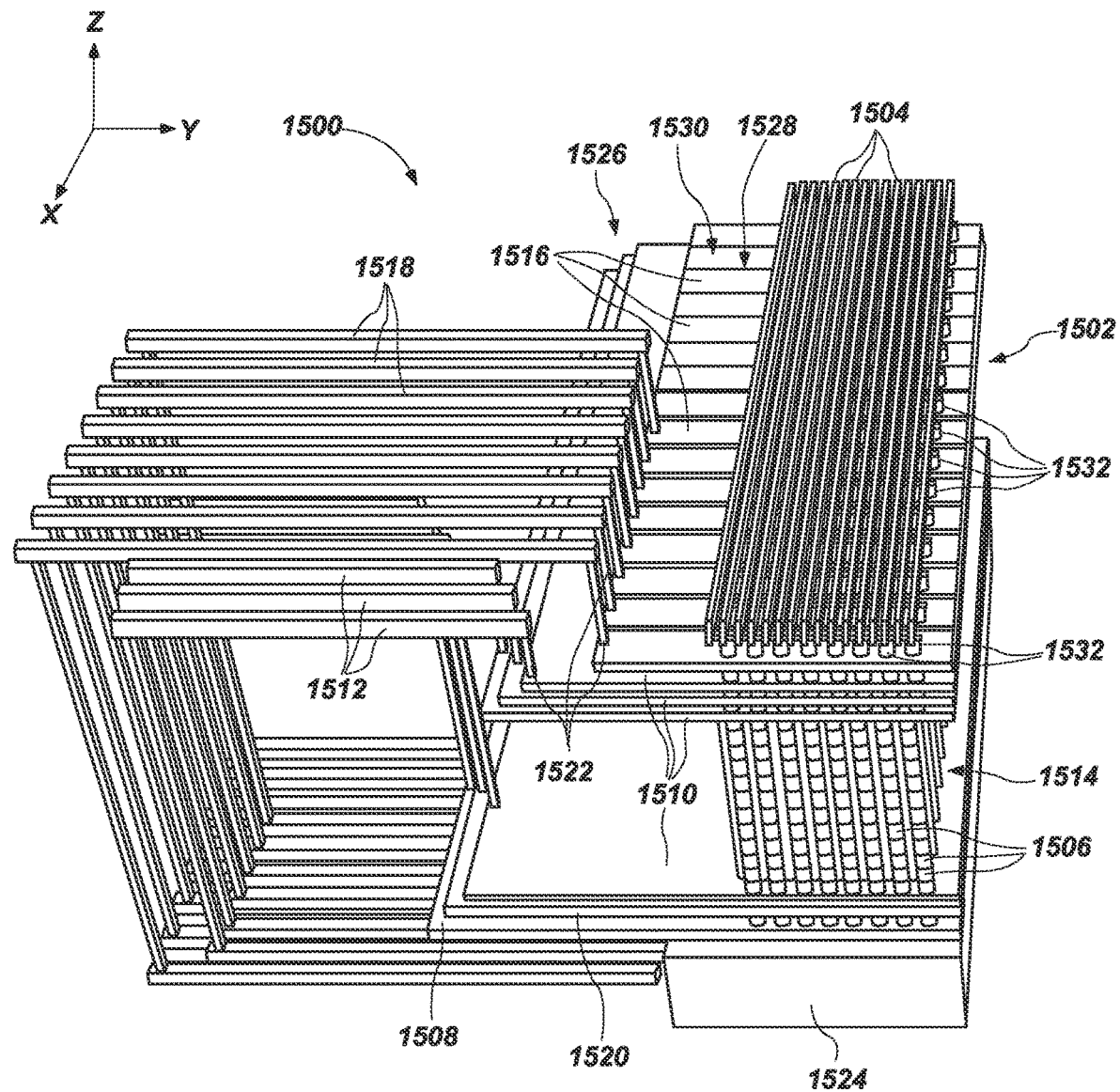
FIG. 4 is a partial, cutaway, perspective, schematic illustration of an apparatus including one or more electronic devices in accordance with embodiments of the disclosure.

With reference to FIG. 4, illustrated is a partial cutaway, perspective, schematic illustration of a portion of an apparatus 1500 (e.g., a memory device) including an electronic device 1502 according to embodiments of the disclosure. The electronic device 1502 may be substantially similar to the embodiments of the electronic device described above (e.g., the microelectronic device structures 100, 301 of FIGS. 1A, 1B, and 3D) and may have been formed by the methods described above. By way of example only, the memory device may be a 3D NAND Flash memory device, such as a multideck 3D NAND Flash memory device. As illustrated in FIG. 4, the electronic device 1502 may include a staircase structure 1526 defining contact regions for connecting access lines (e.g., word lines) 1512 to conductive tiers 1510 (e.g., conductive layers, conductive materials of tiers). The electronic device 1502 may include pillars 155, 157 (see FIGS. 1A and 1B) with strings 1514 (e.g., strings of memory cells) that are coupled to each other in series. The pillars 155, 157 with the strings 1514 may extend at least somewhat vertically (e.g., in the Z-direction) and orthogonally relative to the conductive tiers 1510, relative to data lines 1504, relative to a source tier 1508 (e.g., within one or more base materials under the source stack 105 (see FIGS. 1A and 1B)), relative to the access lines 1512, relative to first select gates 1516 (e.g., upper select gates, drain select gates (SGDs)), relative to select lines 1518, and/or relative to second select gates 1520 (e.g., SGS 185). The first select gates 1516 may be horizontally divided (e.g., in the X-direction) into multiple blocks 1530 by slits 1528.

Vertical conductive contacts 1522 may electrically couple components to each other, as illustrated. For example, the select lines 1518 may be electrically coupled to the first select gates 1516, and the access lines 1512 may be electrically coupled to the conductive tiers 1510. The apparatus 1500 may also include a control unit 1524 positioned under the memory array, which may include at least one of string driver circuitry, pass gates, circuitry for selecting gates, circuitry for selecting conductive lines (e.g., the data lines 1504, the access lines 1512), circuitry for amplifying signals, and circuitry for sensing signals. The control unit 1524 may be electrically coupled to the data lines 1504, the source tier 1508, the access lines 1512, the first select gates 1516, and/or the second select gates 1520, for example. In some embodiments, the control unit 1524 includes CMOS (complementary metal-oxide-semiconductor) circuitry. In such embodiments, the control unit 1524 may be characterized as having a so-called "CMOS under Array" (CuA) configuration.

The first select gates 1516 may extend horizontally in a first direction (e.g., the Y-direction) and may be coupled to respective first groups of strings 1514 of memory cells 1506 at a first end (e.g., an upper end) of the strings 1514. The second select gate 1520 may be formed in a substantially planar configuration and may be coupled to the strings 1514 at a second, opposite end (e.g., a lower end) of the strings 1514 of memory cells 1506.

The data lines 1504 (e.g., bit lines) may extend horizontally in a second direction (e.g., in the X-direction) that is at an angle (e.g., perpendicular) to the first direction in which the first select gates 1516 extend. The data lines 1504 may be coupled to respective second groups of the strings 1514 at the first end (e.g., the upper end) of the strings 1514. A first group of strings 1514 coupled to a respective first select gate 1516 may share a particular string 1514 with a second group of strings 1514 coupled to a respective data line 1504. Thus, a particular string 1514 may be selected at an intersection of a particular first select gate 1516 and a particular data line 1504. Accordingly, the first select gates 1516 may be used for selecting memory cells 1506 of the strings 1514 of memory cells 1506.

The conductive tiers 1510 (e.g., word lines, conductive liner materials 110 (e.g., FIGS. 1A and 1B)) may extend in respective horizontal planes. The conductive tiers 1510 may be stacked vertically, such that each conductive tier 1510 is coupled to all of the strings 1514 of memory cells 1506, and the strings 1514 of the memory cells 1506 extend vertically through the stack of conductive tiers 1510. The conductive tiers 1510 may be coupled to or may function as control gates of the memory cells 1506 to which the conductive tiers 1510 are coupled. Each conductive tier 1510 may be coupled to one memory cell 1506 of a particular string 1514 of memory cells 1506. The first select gates 1516 and the second select gates 1520 may operate to select a particular string 1514 of the memory cells 1506 between a particular data line 1504 and the source tier 1508. Thus, a particular memory cell 1506 may be selected and electrically coupled to a data line 1504 by operation of (e.g., by selecting) the appropriate first select gate 1516, second select gate 1520, and conductive tier 1510 that are coupled to the particular memory cell 1506.

The staircase structure 1526 may be configured to provide electrical connection between the access lines 1512 and the conductive materials of the tiers 1510 through the vertical conductive contacts 1522. In other words, a particular level of the conductive tiers 1510 may be selected via one of the access lines 1512 that is in electrical communication with a respective one of the vertical conductive contacts 1522 in electrical communication with the particular conductive tier 1510. The data lines 1504 may be electrically coupled to the strings 1514 through conductive structures 1532 (e.g., conductive contacts).

Figure 5:
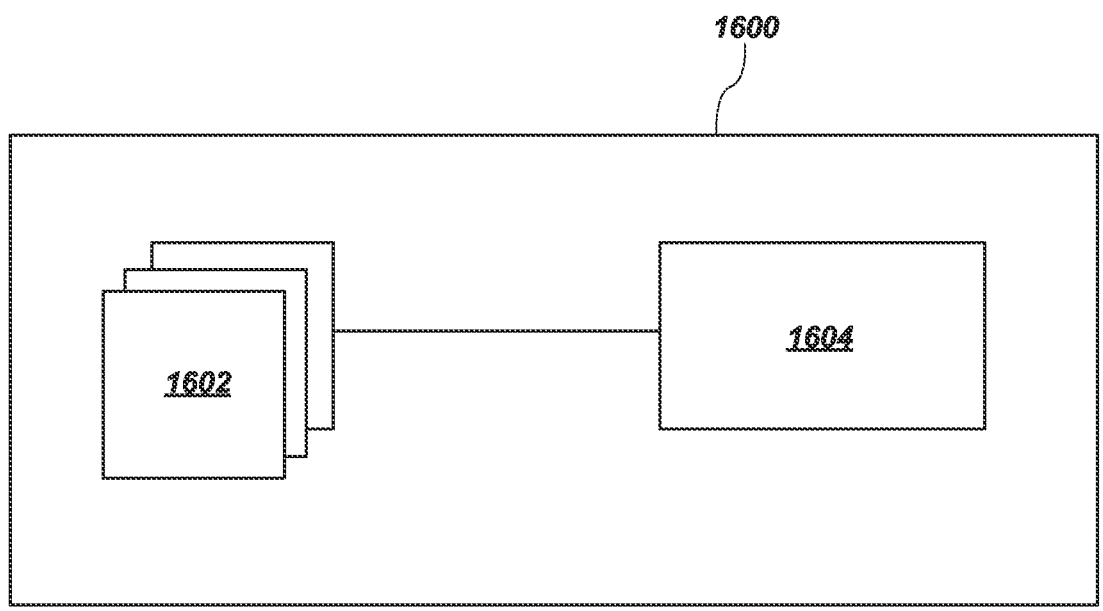
FIG. 5 is a block diagram of an electronic system including one or more microelectronic devices in accordance with embodiments of the disclosure.

The apparatus 1500 including the microelectronic device structures 100, 301 may be used in embodiments of electronic systems of the disclosure. FIG. 5 is a block diagram of an electronic system 1600, in accordance with embodiments of the disclosure. The electronic system 1600 includes, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 1600 includes at least one memory device 1602 that includes, for example, one or more microelectronic device structures 100, 301. The electronic system 1600 may further include at least one electronic signal processor device 1604 (e.g., a microprocessor). The electronic signal processor device 1604 may, optionally, include one or more microelectronic device structures 100, 301.

Figure 6:
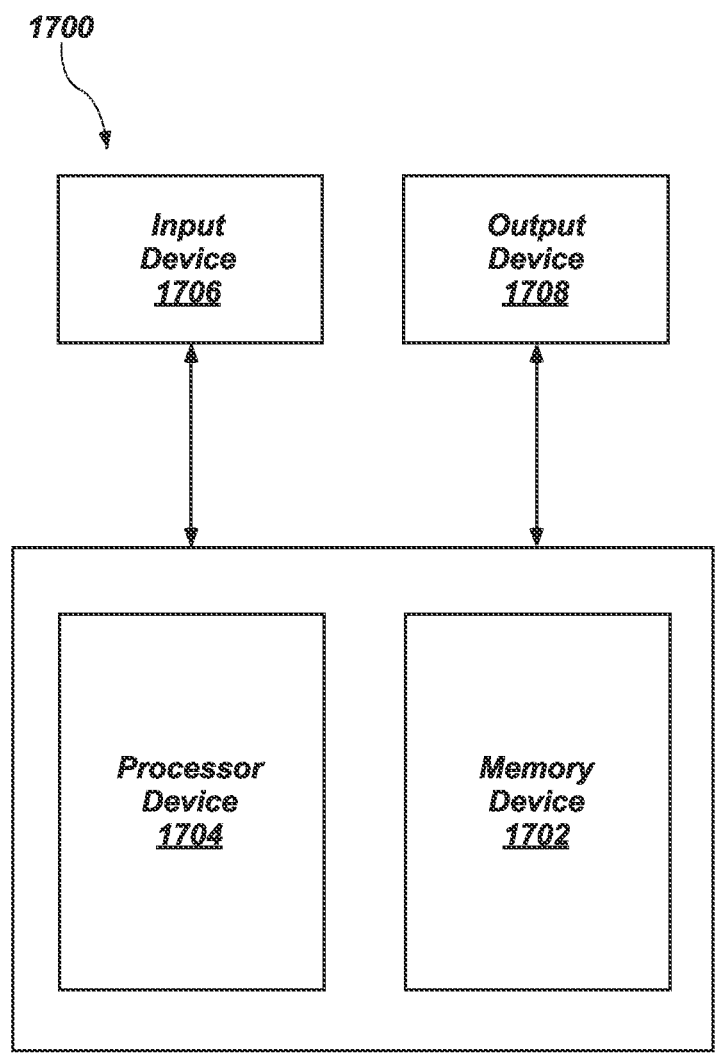
FIG. 6 is a block diagram of a processor-based system including one or more microelectronic devices in accordance with embodiments of the disclosure.

A processor-based system 1700 (e.g., an electronic processor-based system 1700), shown in FIG. 6, includes one or more input devices 1706 for inputting information into the processor-based system 1700 by a user, such as, for example, a mouse or other pointing device, a keyboard, a touchpad, a button, or a control panel. The processor-based system 1700 may further include one or more output devices 1708 for outputting information (e.g., visual or audio output) to a user such as, for example, a monitor, a display, a printer, an audio output jack, a speaker, etc. In some embodiments, the input device 1706 and the output device 1708 may comprise a single touchscreen device that can be used both to input information into the processor-based system 1700 and to output visual information to a user. The input device 1706 and the output device 1708 may communicate electrically with one or more of the memory device 1702 and the electronic signal processor device 1704. The memory device 1702 and the electronic signal processor device 1704 may include one or more of the microelectronic device structures 100, 301.

Accordingly, disclosed is an electronic system comprising a processor device operably coupled to an input device and to an output device. One or more memory devices are operably coupled to the processor device and comprise one or more electronic devices. The electronic devices comprise a source contact adjacent to a source stack and a dielectric material adjacent to the source contact. The dielectric material comprises a doped dielectric material or a high-k dielectric material. Tiers of alternating conductive materials and dielectric materials are adjacent to the dielectric material and memory pillars extend through the tiers, the dielectric material, and the source contact. The memory pillars extend partially into the source stack.

Figure 7:
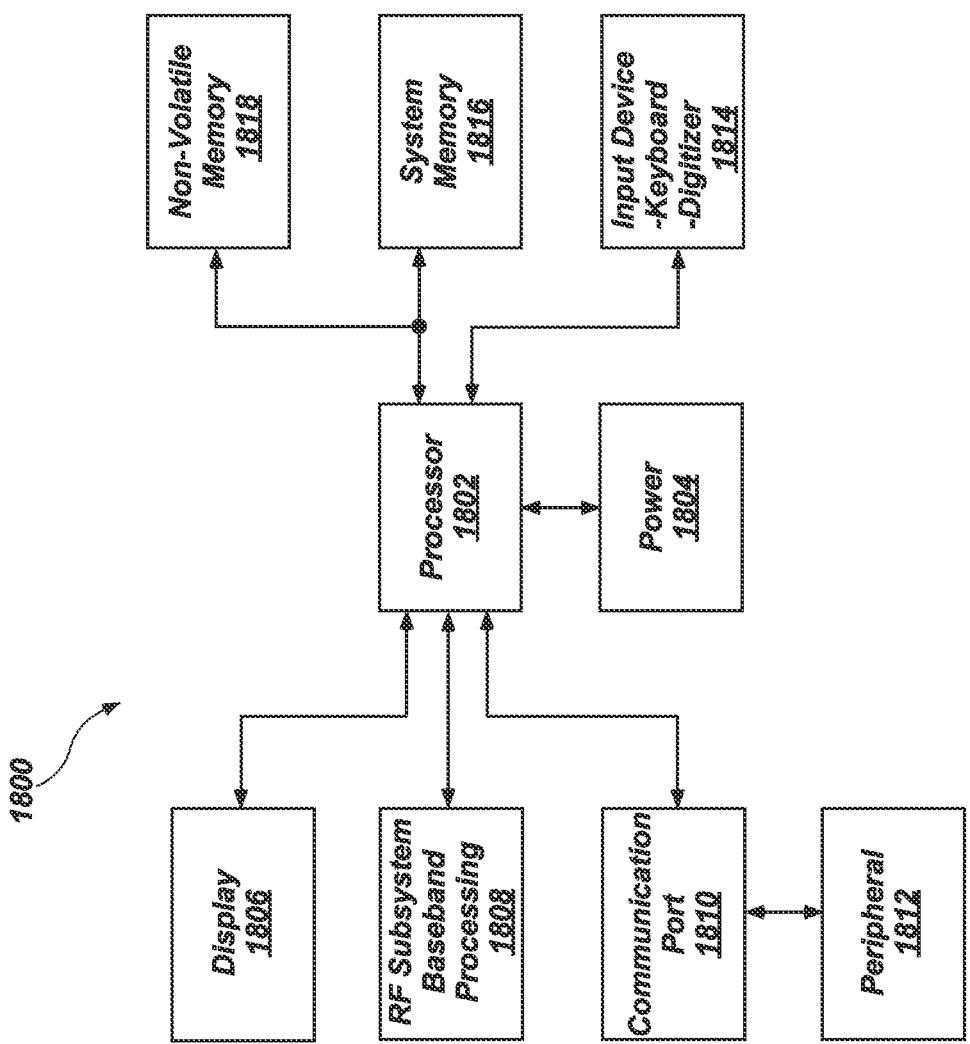
FIG. 7 is a block diagram of an additional processor-based system including one or more microelectronic devices in accordance with embodiments of the disclosure.

With reference to FIG. 7, shown is a block diagram of an additional processor-based system 1800 (e.g., an electronic processor-based system 1800). The processor-based system 1800 may include various microelectronic device structures 100, 301 and apparatus 1500 manufactured in accordance with embodiments of the disclosure. The processor-based system 1800 may be any of a variety of types, such as a computer, a pager, a cellular phone, a personal organizer, a control circuit, or another electronic device. The processor-based system 1800 may include one or more processors 1802, such as a microprocessor, to control the processing of system functions and requests in the processor-based system 1800. The processor 1802 and other subcomponents of the processor-based system 1800 may include microelectronic device structures 100, 301 and apparatus 1500 manufactured in accordance with embodiments of the disclosure.

The processor-based system 1800 may include a power supply 1804 in operable communication with the processor 1802. For example, if the processor-based system 1800 is a portable system, the power supply 1804 may include one or more of a fuel cell, a power scavenging device, permanent batteries, replaceable batteries, and/or rechargeable batteries. The power supply 1804 may also include an AC adapter if, for example, the processor-based system 1800 may be plugged into a wall outlet. The power supply 1804 may also include a DC adapter such that the processor-based system 1800 may be plugged into a vehicle cigarette lighter or a vehicle power port, for example.

Various other devices may be coupled to the processor 1802 depending on the functions that the processor-based system 1800 performs. For example, a user interface may be coupled to the processor 1802. The user interface may include one or more input devices 1814, such as buttons, switches, a keyboard, a light pen, a mouse, a digitizer and stylus, a touch screen, a voice recognition system, a microphone, or a combination thereof. A display 1806 may also be coupled to the processor 1802. The display 1806 may include an LCD display, an SED display, a CRT display, a DLP display, a plasma display, an OLED display, an LED display, a three-dimensional projection, an audio display, or a combination thereof. Furthermore, an RF subsystem/baseband processor 1808 may also be coupled to the processor 1802. The RF subsystem/baseband processor 1808 may include an antenna that is coupled to an RF receiver and to an RF transmitter. A communication port 1810, or more than one communication port 1810, may also be coupled to the processor 1802. The communication port 1810 may be adapted to be coupled to one or more peripheral devices 1812 (e.g., a modem, a printer, a computer, a scanner, a camera) and/or to a network (e.g., a local area network (LAN), a remote area network, an intranet, or the Internet).

The processor 1802 may control the processor-based system 1800 by implementing software programs stored in the memory (e.g., system memory 1816). The software programs may include an operating system, database software, drafting software, word processing software, media editing software, and/or media-playing software, for example. The memory is operably coupled to the processor 1802 to store and facilitate execution of various programs. For example, the processor 1802 may be coupled to system memory 1816, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 1816 may include volatile memory, nonvolatile memory, or a combination thereof. The system memory 1816 is typically large so it can store dynamically loaded applications and data. The system memory 1816 may include one or more apparatus 1500 and one or more microelectronic device structures 100, 301 according to embodiments of the disclosure.

The processor 1802 may also be coupled to nonvolatile memory 1818, which is not to suggest that system memory 1816 is necessarily volatile. The nonvolatile memory 1818 may include one or more of STT-MRAM, MRAM, read-only memory (ROM) (e.g., EPROM, resistive read-only memory (RROM)), and Flash memory to be used in conjunction with the system memory 1816. The size of the nonvolatile memory 1818 is typically selected to be just large enough to store any necessary operating system, application programs, and fixed data. Additionally, the nonvolatile memory 1818 may include a high-capacity memory (e.g., disk drive memory, such as a hybrid-drive including resistive memory or other types of nonvolatile solid-state memory, for example). The nonvolatile memory 1818 may include one or more apparatus 1500 and one or more microelectronic device structures 100, 301 according to embodiments of the disclosure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:
1. A microelectronic device, comprising:
a source stack comprising one or more conductive materials;
a source contact vertically adjacent to the source stack;
a semiconductor material vertically adjacent to the source contact;

tiers of alternating conductive materials and dielectric materials vertically adjacent to the semiconductor material;

a dielectric structure extending through the tiers of the microelectronic device to the source contact of the microelectronic device;

first and second insulative cap structures laterally between the semiconductor material and the dielectric structure, the first insulative cap structure exhibiting a width that is different than a width of the second insulative cap structure; and memory pillars extending through the tiers, the semiconductor material, and the source contact and into the source stack.

2. The microelectronic device of claim 1, wherein the semiconductor material is recessed away from the dielectric structure in a lateral direction relative to sidewalls of the tiers on at least one lateral side of the dielectric structure.

3. The microelectronic device of claim 2, wherein on the at least one lateral side of the dielectric structure, the semiconductor material terminates at a lateral edge surface of the semiconductor material facing the dielectric structure, the lateral edge surface of the semiconductor material being spaced apart from the dielectric structure.

4. The microelectronic device of claim 3, wherein one of the first or second insulative cap structures is between the lateral edge surface of the semiconductor material and the dielectric structure.

5. The microelectronic device of claim 1, wherein at least one of the first or second insulative cap structures has a lateral width of at least about 30.0 nm.

6. The microelectronic device of claim 1, wherein the first and second insulative cap structures comprise silicon oxide.

7. The microelectronic device of claim 1, further comprising an insulative cap material vertically between the semiconductor material and the tiers.

8. The microelectronic device of claim 7, wherein the first and second insulative cap structures are vertically between the insulative cap material and the source contact.

9. The microelectronic device of claim 1, wherein the source contact is below the semiconductor material and extends laterally between adjacent memory pillars and to a channel of the memory pillars.

10. The microelectronic device of claim 9, wherein the source contact directly contacts the semiconductor material, the source stack, and the channel of the memory pillars.

11. The microelectronic device of claim 9, wherein the source contact directly contacts the channel of the memory pillars.

12. A microelectronic device, comprising:
a semiconductor material between a stack structure and a source contact, the stack structure comprising tiers of a vertically alternating sequence of conductive structures and insulating structures, a dielectric structure vertically extending through the stack structure and the semiconductor material to the source contact;

oxide cap structures between the dielectric structure and the semiconductor material, the oxide cap structures exhibiting different widths; and memory pillars extending through the tiers, the semiconductor material, and the source contact, the source contact directly contacting a channel of the memory pillars.

13. The microelectronic device of claim 12, wherein the semiconductor material comprises polysilicon.

14. The microelectronic device of claim 12, wherein the source contact comprises doped polysilicon.

15. The microelectronic device of claim 12, wherein an upper surface of the source contact directly contacts the semiconductor material and the oxide cap structures and a lower surface of the source contact directly contacts a source stack.

16. The microelectronic device of claim 15, wherein the memory pillars extend partially into the source stack.

17. The microelectronic device of claim 12, wherein the source contact comprises a substantially continuous conductive material extending laterally and directly contacting the channel.

18. The microelectronic device of claim 12, wherein the source contact comprises an oxidized portion directly contacting the dielectric structure.

19. A method of forming a microelectronic device, the method comprising:
forming a source contact sacrificial structure vertically adjacent to a source stack;

forming a semiconductor material vertically adjacent to the source contact sacrificial structure;

forming an insulative cap material vertically adjacent to the semiconductor material;

forming a recess through the insulative cap material and the semiconductor material;

laterally removing a portion of the semiconductor material relative to the insulative cap material to define gaps between the source contact sacrificial structure and the insulative cap material on opposing lateral sides of the recess;

forming an oxide material in the gaps and forming a slit sacrificial structure within the recess to form a first and second insulative cap structure laterally adjacent to the semiconductor material and laterally between the semiconductor material and the slit sacrificial structure;

forming tiers of a vertically alternating sequence of conductive structures and insulating structures vertically adjacent to the insulative cap material;

forming memory pillars through the tiers, the semiconductor material, and into the source stack;

forming a slit through the tiers and removing the slit sacrificial structure to expose the source contact sacrificial structure, the first and second insulative cap structures remaining laterally between the slit and the semiconductor material, and the first insulative cap structure exhibiting a width that is different than a width of the second insulative cap structure;

selectively removing the source contact sacrificial structure to form a source contact opening;

forming a conductive material in the source contact opening to form a source contact extending laterally and contacting the memory pillars; and at least substantially filling the slit with a dielectric material.

20. The method of claim 19, further comprising: oxidizing a portion of the source contact exposed through the slit.

21. The method of claim 19, wherein forming a slit sacrificial structure comprises:
forming a liner material within the recess; and
filling a remaining volume of the recess with one or more conductive materials.

22. The method of claim 19, further comprising replacing nitride materials of the tiers with conductive materials.

23. The method of claim 19, wherein forming the conductive material in the source contact opening to form the source contact comprises forming the source contact to directly contact channels of the memory pillars.

24. An electronic system, comprising:
an input device;
an output device;
a processor device operably coupled to the input device and to the output device; and
one or more memory devices operably coupled to the processor device and comprising one or more microelectronic devices, the one or more microelectronic devices comprising:
  a source contact vertically adjacent to a source stack;
  a dielectric-filled slot structure vertically adjacent to the source contact, the dielectric-filled slot structure extending through tiers of alternating conductive materials and insulative materials;
  a semiconductor material vertically adjacent to the source contact and laterally spaced from the dielectric-filled slot structure on opposing lateral sides of the dielectric-filled slot structure;
  cap structures laterally between the dielectric-filled slot structure and the semiconductor material, the cap structures exhibiting different widths; and
  memory pillars extending through the tiers, the semiconductor material, and the source contact and partially into the source stack.

25. The electronic system of claim 24, wherein the semiconductor material is recessed away from the dielectric-filled slot structure in a lateral direction relative to the tiers on both lateral sides of the dielectric-filled slot structure.

* * * * *